US006877125B2

(12) United States Patent
Le Bars et al.

(10) Patent No.: US 6,877,125 B2
(45) Date of Patent: Apr. 5, 2005

(54) DEVICES AND METHODS FOR ESTIMATING A SERIES OF SYMBOLS

(75) Inventors: Philippe Le Bars, Thorigne-Fouillard (FR); Sylvain Olier, Pluguffan (FR)

(73) Assignee: Canon Kabushiki Kaisha, Tokyo (JP)

( * ) Notice: Subject to any disclaimer, the term of this patent is extended or adjusted under 35 U.S.C. 154(b) by 530 days.

(21) Appl. No.: 09/953,254

(22) Filed: Sep. 17, 2001

(65) Prior Publication Data

US 2002/0065859 A1 May 30, 2002

(30) Foreign Application Priority Data

Sep. 18, 2000 (FR) .............................. 00 11899
Sep. 18, 2000 (FR) .............................. 00 11898

(51) Int. Cl.$^7$ ............................................ H03M 13/00
(52) U.S. Cl. ..................... 714/755; 714/780
(58) Field of Search ................. 714/755, 780, 714/786, 792; 375/242

(56) References Cited

U.S. PATENT DOCUMENTS 6,563,877 B1 * 5/2003 Abbaszadeh ................ 375/242

FOREIGN PATENT DOCUMENTS

| EP | 0 963 048 A2 | 12/1999 | .......... H03M/13/00 |
| WO | 99/16222 | 4/1999 | ........... H04L/27/06 |

OTHER PUBLICATIONS

C. Chaikalis et al., "Reconfiguration Between Soft Output Viterbi and Log Maximum a Posteriori Decoding Algorithms", 3G Mobile Communication Technologies, Conference Publication No. 471, IEE Mar. 2000, pp. 316–320.

H. Michael et al, "Influence of Quantization on the Bit–Error Performance of Turbo–Decoders", VTC2000, May 2000 IEEE 51st Vehicular Technology Conference Proceedings (CAT. No. 00CH37026), pp. 581–585.

L.R. Bahl et al., "Optimal decoding of linear codes for minimizing symbol error rate", IEEE Transactions on Information Theory, Mar. 1974, pp. 284–287.

C. Berrou et al., "Near Shannon Limit Error–Correcting Coding and Decoding: Turbo–codes(1)", Proceedings of the International Conference on Communications (ICC) US, N w York, IEEE, vol. 2/3, May 23, 1993, p. 1064–1070.

C. Berrou et al. "Near Optimum Error Correcting Coding and Decoding: Turbo–Codes", IEEE Transactions on Communications, vol. 44, No. 10, Oct. 1996, pp. 1261–1271.

Steven S. Pietrobon, "Implementation and Performance of a Serial MAP Decoder for Us in an Iterative Turbo Decoder", Annals of the IEEE International Symposium on Information Theory, Whistler, B.C., Canada, Sep. 17–22, 1995 (21 pages).

(Continued)

Primary Examiner—Phung My Chung
(74) Attorney, Agent, or Firm—Fitzpatrick, Cella, Harper & Scinto

(57) ABSTRACT

Estimation of symbols related to each other by a parity relationship previously created by an encoder, is effected by a function having several components effecting a calculation of probabilities corresponding to a state of the encoder. The probabilities are of a first type, resulting from the observation of the effects of the previous states of the encoder on the current state, of a second type, resulting from the observation of the effects of the subsequent states of the encoder on the current state, and of a third type, representing the belonging of a symbol to a predetermined part of an encoding alphabet. A specific multiplexer is controlled by a state machine and cooperates with a calculator so that not only the probabilities of the first and second types but also the probabilities of the third type are obtained by one and the same circuit.

62 Claims, 17 Drawing Sheets

OTHER PUBLICATIONS

J.-F. Cheng et al., "Linearly Approximated Log–MAP Algorithms for Turbo Decoding", Annals of the Conference "Vehicular Technology" (VCT), Tokyo, May 18, 2000, (5 pages).

P. Robertson t al., "Optimal and Sub–Optimal Maximum a Posteriori Algorithm Suitabl for Turbo D coding", European Transactions on Telecommunications (ETT), V 1.8, No. 2, Mar.–Apr. 1997, pp. 119–125.

Steven S. Pietrobon, "Implementation and Performance of a Serial MAP Decoder for Use in an Iterative Turbo Decoder", Satellite Communications Research Centre, University of South Australia, The Levels SA 5095, Australia, p. 471.

* cited by examiner

DEVICES AND METHODS FOR ESTIMATING A SERIES OF SYMBOLS

BACKGROUND OF THE INVENTION

1. Field of the Invention

The present invention relates to devices and methods for estimating a series of symbols.

According to a first aspect, the invention relates to a device and a method for estimating a series of symbols with reduced implementation, and to corresponding circuits and systems.

According to a second aspect, the invention relates to a method and a device for estimating a series of symbols using a conditional correction, and to associated systems.

The invention finds particular application in the decoding according to the "BCJR" algorithm proposed by Bahl, Cocke, Jellnek and Raviv and described in their article entitled "*Optimal decoding of linear codes for minimizing symbol error rate*", in IEEE Transactions on Information Theory, March 1974, pages 284–287.

Thanks to the first aspect of the invention, the number of logic gates necessary for this algorithm may advantageously be reduced, for example in equipment of the FPGA ("Field Programmable Gate Array") or ASIC ("Application-Specific Integrated Circuit") type, in particular when the detector included in the decoder is constructed for calculating a posteriori probabilities in accordance with a "Log-MAP" (MAP standing for "Maximum A Posteriori") algorithm, using Jacobian logarithms.

According to its second aspect, the invention, which belongs to the field of encoding/decoding, concerns a method of estimating received symbols which uses an algorithm of the "Log-MAP" type (MAP standing for "Maximum A Posteriori"), whose principle is stated below. It deals with the application, in certain cases, of a correction value in the context of the determination of the probabilities related to the states of the encoder, to remedy the degradation of the performance usually caused by quantisation in this type of decoding technique, as explained below.

The invention is described here more particularly in its application to turbodecoding, by way of example that is in no way limitative. The invention can be applied to other fields, such as for example the field of equalisation.

2. Description of the Related Art

Turbocodes are very advantageous in conditions of low signal to noise ratio (SNR). A conventional turbo-encoder is constituted by two recursive systematic convolutional encoders (RSC), and an interleaver, disposed as shown in FIG. 1. The turbo-encoder outputs three series of binary elements (x, y1, y2), where x is the so-called systematic output of the turbo-encoder, that is to say one which has undergone no processing compared with the input signal x, y1 is the output encoded by the first RSC encoder, and y2 is the output encoded by the second RSC encoder after passing through the interleaver.

For more details on turbocodes, reference can usefully be made to the article by C. Berrou, A. Glavieux and P. Thitimajshima entitled "*Near Shannon limit error-correcting coding and decoding: turbo-codes*", ICC '93, Geneva, or to the article by C. Berrou and A. Glavieux entitled "*Near Optimum Error Correcting Coding and Decoding: Turbo-Codes*", in IEEE Transactions on Communications, vol. 44, No. 10, October 1996.

FIG. 2 depicts an example of a conventional turbodecoder able to decode data supplied by a turbo-encoder such as the one in FIG. 1. The inputs x', y1', y2' of the turbodecoder are the outputs of the turbo-encoder altered by the transmission channel and the transmission and reception processes. The structure of such a turbodecoder is well known to persons skilled in the art and will therefore not be described in detail here.

It requires in particular two decoders, referred to as "Decoder 1" and "Decoder 2" in FIG. 2; these decoders can be of the BCJR type mentioned above or, as a variant, of the SOVA type ("Soft Output Viterbi Algorithm").

A conventional turbodecoder also requires a loop back of the output of the deinterleaver π2 onto the input of the first decoder, in order to transmit the so-called "extrinsic" information from the second decoder to the first decoder.

Such a decoding system uses an exploration of the probabilities according to the chronological order of arrival of the symbols (first symbol received, first symbol decoded), but also in the opposite direction to this chronological order (last symbol received, first symbol decoded). This appears in the descriptive elements of the BCJR decoder below.

The actual structure of a MAP decoder at each time k uses not only the systematic (noisy) received data $y_k^s$ and the parities issuing from the encoder and received noisy $y_k^p$, but also an average of the noise σ and the extrinsic information coming from the other decoder.

The purpose of the decoding is to estimate the consecutive states of the encoder according to the knowledge that is available, that is to say from the sequence of noisy received information.

FIG. 3 illustrates such a decoder. The input $y_k^s$ of the MAP decoder corresponds to the input x' of the turbodecoder illustrated in FIG. 2, the input $y_k^p$ corresponds to the input y1' or y2' of FIG. 2 depending on whether it relates to decoder 1 or 2, and L'e corresponds to $L_4$ or $L_2$. The variable σ corresponds to the effective value of the noise. It is used in the decoder in the form of noise power, in order to normalise the values of $y_k^s$ and $y_k^p$.

If it is considered that the data are encoded not in binary (0 or 1) but in NRZ (Non-Return to Zero), that is to say with data transmitted on levels +1 or −1, the decoder seeks to decide whether the noisy received data was initially a "+1" or a "−1".

Let $\hat{u}_k$ be the result of this decision, let $u_k$ be the original data sent and let Y be the complete sequence of received encoded information.

The decision is the following operation, denoting the probability as P:

$\hat{u}_k = +1$ if $P(u_k=+1|Y) > P(u_k=-1|Y)$ $\hat{u}_k = -1$ if $P(u_k=+1|Y) < P(u_k=-1|Y)$ Thus the decision $\hat{u}_k$ is given by the sign of the variable $L(u_k)$, defined as the Logarithm of the ratio of the A Posteriori Probabilities (LAPP).

$$L(u_k) \triangleq \ln\left(\frac{P(u_k = +1|Y)}{P(u_k = -1|Y)}\right).$$

Let S be the set of the possible states of the encoder.
Using the concept of code trellis:

$$L(u_k) = \ln\left(\frac{\sum_{S+} p(s_{k-1}=s', s_k=s)/p(Y)}{\sum_{S-} p(s_{k-1}=s', s_k=s)/p(Y)}\right) \quad (1)$$

where:

$s_k \in S$ is the state of the encoder at time k,

S+ is the set of the pairs of states (s',s) corresponding to all the transitions $(s_{k-1}=s') \to (s_k=s)$ caused by an input of the encoder $u_k=+1$, and S− is defined in a similar manner for $u_k=-1$.

It can be seen that it is possible to eliminate p(Y) in equation (1). This means that only one algorithm is needed for calculating $p(s',s,Y)=p(s_{k-1}=s', s_k=s, Y)$.

According to the BCJR algorithm, $$p(s',s,Y)=\alpha_{k-1}(s')\gamma_k(s',s)\beta_k(s) \quad (2)$$

with:

$$\alpha_k(s) \triangleq p(s_k=s, Y_1^k) = \sum_{s' \in S} \alpha_{k-1}(s')\gamma_k(s', s) \quad (3)$$

$$\beta_{k-1}(s') \triangleq p(Y_{k+1}^N | s_k=s) = \sum_{s \in S} \beta_k(s)\gamma_k(s', s)$$

$$\gamma_k(s', s) \triangleq p(s_k=s, y_k | s_{k-1}=s')$$

$$\gamma_k(s',s) \triangleq p(s_k=s, y_k | s_{k-1}=s')$$

where α and β represent the probabilities of obtaining the states S at time k. The probabilities α and β are calculated in a recursion, respectively starting from the initial state (that is to say the first symbols received), and starting from the final state (that is to say the last symbols received), with:

$\alpha_0(0)=1$ and $\alpha_0(s \neq 0)=0$ $\beta_N(0)=1$ and $\beta_N(s \neq 0)=0$ if the encoder starts from a zero state and finishes in a zero state, the index N designating the length of the data frame received and therefore corresponding to the last symbol received. There are (N+1)×Ns values of probabilities α and N×Ns values of probabilities β, Ns being the number of possible states of the encoder. This is why the α are numbered from 0 to N and the β, from 1 to N.

The elimination of the factor p(Y) in equation (1) gives numerical instability. This can be avoided by using probabilities modified as follows:

$\tilde{\alpha}_k(s) \triangleq \alpha_k(s)/p(Y_1^k)$ $\tilde{\beta}_k(s) \triangleq \beta_k(s)/p(Y_{k+1}^N | Y_1^k)$ which can be re-written as follows:

$$\tilde{\alpha}_k(s) = \frac{\sum_{s'} \tilde{\alpha}_{k-1}(s')\gamma_k(s', s)}{\sum_s \sum_{s'} \tilde{\alpha}_{k-1}(s')\gamma_k(s', s)} \quad (4)$$

$$\tilde{\beta}_{k-1}(s') = \frac{\sum_s \tilde{\beta}_k(s)\gamma_k(s', s)}{\sum_{s'} \sum_s \tilde{\beta}_k(s)\gamma_k(s', s)}$$

Dividing equation (2) by $p(Y)/p(y_k)=p(Y_1^{k-1}) \cdot p(Y_{k+1}^N | Y_1^k)$, there is obtained:

$$p(s',s|Y)/p(y_k)=\tilde{\alpha}_{k-1}(s')\gamma_k(s',s)\tilde{\beta}_k(s) \quad (5)$$

Now the BCJR-MAP algorithm amounts to calculating the LAPP, defined above and denoted $L(u_k)$, by combining equations (1) and (5):

$$L(u_k) = \ln\left(\frac{\sum_{S+} \tilde{\alpha}_{k-1}(s')\gamma_k(s', s)\tilde{\beta}_k(s)}{\sum_{S-} \tilde{\alpha}_{k-1}(s')\gamma_k(s', s)\tilde{\beta}_k(s)}\right) \quad (6)$$

the probabilities α and the β being calculated recursively by equation (4).

Let this result be applied to the turbocodes, for a parallel iterative convolutional code, in an additive white Gaussian noise (AWGN) channel. By the Bayes theorem, the LAPP of the MAP decoder can be written;

$$L(u_k) = \ln\left(\frac{P(Y | u_k=+1)}{P(Y | u_k=-1)}\right) + \ln\left(\frac{P(u_k=+1)}{P(u_k=-1)}\right)$$

where the second term of the sum represents the a priori information. Given that in general $P(u_k+1)=P(u_k=-1)$, the a priori information is zero for convolution encoders.

However, in an iterative decoder, the decoder 1 (denoted $D_1$) receives extrinsic information or a soft decision for each $u_k$ coming from decoder 2 (denoted $D_2$), which serves as a priori information for $D_1$, which initiates the mechanism $D_1 \to D_2 \to D_1 \to \ldots$, the decoder delivering a soft decision at each half-iteration for the following decoder (except for the first decoding). These soft decisions result from the use of two different encoders after interleaving; they are therefore decorrelated.

A description is now given of a way of obtaining this extrinsic information, from equation (3), $\gamma_k(s',s)$ can be written:

$$\gamma_k(s',s)=P(s|s')p(y_k|s',s)=P(u_k)p(y_k|u_k) \quad (7)$$

Defining:

$$L^e(u_k) \triangleq \ln\left(\frac{P(u_k=+1)}{P(u_k=-1)}\right) \quad (8)$$

it is possible to write:

$$P(u_k) = \left(\frac{\exp(-L^e(u_k)/2)}{1+\exp(-L^e(u_k))}\right)\exp(u_k L^e(u_k)/2)$$
$$= A_k \exp(u_k L^e(u_k)/2)$$

-continued $$p(y_k \mid u_k) \propto \exp\left(\frac{-(y_k^s - u_k)^2}{2\sigma^2} - \frac{(y_k^p - x_k^p)^2}{2\sigma^2}\right)$$

$$= B_k \exp\left(\frac{u_k y_k^s + y_k^p x_k^p}{\sigma^2}\right)$$

where $y_k^s$ is the systematic data item received and $y_k^p$ is the corresponding parity issuing from the encoder, at time k. Then:

$$\gamma_k(s', s) \propto A_k B_k \exp(u_k L^e(u_k)/2) \exp\left(\frac{u_k y_k^s + y_k^p x_k^p}{\sigma^2}\right)$$

Now, $\gamma_k(s',s)$ appears in the numerator and denominator of equation (6). The factor $A_k B_k$ disappears since it is independent of $u_k$.

Let $2E_c/N_0 = 1/\sigma^2$ and $\sigma^2 = N_0/2E_c$, where $E_c = R_c E_b$ is the energy per bit, since symbols $\{-1,+1\}$ are transmitted in the channel, $N_0$ being the energy of the noise of the channel. In equation (7), the following can be derived:

$$\gamma_k(s', s) \sim \exp\left(\frac{1}{2}u_k(L^e(u_k) + L_c y_k^s)\right) + \frac{1}{2}u_k L_c y_k^p x_k^p \quad (9)$$

$$= \exp\left(\frac{1}{2}u_k(L^e(u_k) + L_c y_k^s)\right) \gamma_k^e(s', s)$$

with:

$$\gamma_k^e(s', s) \triangleq \exp\left(\frac{1}{2} L_c y_k^p x_k^p\right)$$

$$L_c \triangleq \frac{4E_c}{N_0}$$

By combining (8) and (9), there is obtained:

$$L(u_k) = \ln\left(\frac{\sum_{S^+} \tilde{\alpha}_{k-1}(s') \gamma_k^e(s', s) \tilde{\beta}_k(s) C_k}{\sum_{S^-} \tilde{\alpha}_{k-1}(s') \gamma_k^e(s', s) \tilde{\beta}_k(s) C_k}\right) \quad (10)$$

$$= L_c y_k^s + L^e(u_k) + \ln\left(\frac{\sum_{S^+} \tilde{\alpha}_{k-1}(s') \gamma_k^e(s', s) \tilde{\beta}_k(s)}{\sum_{S^-} \tilde{\alpha}_{k-1}(s') \gamma_k^e(s', s) \tilde{\beta}_k(s)}\right)$$

The second equality in equation (10) above is justified by the fact that the quantity $$C_k \triangleq \exp\left(\frac{1}{2}u_k(L^e(u_k) + L_c y_k^s)\right)$$

can be put as a factor in the summations of the numerator and denominator.

The last term of equation (10) represents the extrinsic information passed from one decoder to the other. The final decision can be obtained on the basis of the following formula:

$$L_1(u_k) = L_c y_k^s + L_{2 \to 1}^e(u_k) + L_{1 \to 2}^e(u_k)$$

where $L_{2 \to 1}^e(u_k)$ is the extrinsic information transmitted from $D_2$ to $D_1$ and $L_{1 \to 2}^e(u_k)$ is the extrinsic information transmitted from $D_1$ to $D_2$.

In general terms, upon hardware implementation of a function, a person skilled in the art seeks to avoid multiplications, which are expensive in terms of surface area of silicon. It is well known that the hardware cost is an increasing function of the surface area of silicon engaged in implementing a function. A person skilled in the art generally seeks a balance between the speed of execution of the function and the resulting surface area of silicon.

To avoid the use of multipliers, it is known that use can be made of the natural logarithm of the calculation functions for the probabilities α and β defined above:

$$\bar{\alpha}_k(s) = \ln\left(\sum_{s'} \exp^{\bar{\alpha}_{k-1}(s') + \bar{\gamma}_k(s', s)}\right) - \ln\left(\sum_s \sum_{s'} \exp^{\bar{\alpha}_{k-1}(s') + \bar{\gamma}_k(s', s)}\right) \quad (11)$$

$$\bar{\beta}_{k-1}(s') = \ln\left(\sum_s \exp^{\bar{\beta}_k(s) + \bar{\gamma}_k(s', s)}\right) - \ln\left(\sum_{s'} \sum_s \exp^{\bar{\beta}_k(s) + \bar{\gamma}_k(s', s)}\right)$$

$$\bar{\gamma}_k(s', s) \sim \frac{1}{2}u_k(L^e(u_k) + L_c y_k^s) + \bar{\gamma}_k^e(s', s)$$

$$\bar{\gamma}_k^e(s', s) \triangleq \ln(\gamma_k^e(s', s)) = \frac{1}{2} L_c y_k^p x_k^p \text{ and } L_c \triangleq \frac{4E_c}{N_0}$$

The output obtained is the log likelihood:

$$L^e(u_k) = \quad (12)$$

$$\ln\left(\sum_{S^+} \exp^{\bar{\alpha}_{k-1}(s') + \bar{\gamma}_k^e(s', s) + \bar{\beta}_k(s)}\right) - \ln\left(\sum_{S^-} \exp^{\bar{\alpha}_{k-1}(s') + \bar{\gamma}_k^e(s', s) + \bar{\beta}_k(s)}\right)$$

From this finding, obtaining the probabilities related to the nodes of the trellis amounts to calculating the quantity:

$$\Delta_N = \ln(\exp^{\delta_0} + \exp^{\delta_1} + \ldots \exp^{\delta_i} + \ldots \exp^{\delta_N})$$

where N designates the length of the data frame received and where $\delta_i$, for i=0 to Ns, is equal for example to $\bar{\alpha}_{k-1}(s') + \bar{\gamma}(s',s)$, or $\bar{\beta}_{k-1}(s') + \bar{\gamma}(s',s)$, etc.

This quantity is calculated recursively, using the Jacobian logarithm; the recursion formula can be written as follows:

$$\Delta_i = \ln(\exp^{\Delta_{i-1}} + \exp^{\delta_i}) = \max(\Delta_{i-1}, \delta_i) + f_c(|\Delta_{i-1} - \delta_i|) \quad (13)$$

with $$\Delta_1 = \ln(\exp^{\delta_1}) = \delta_1$$

and $$f_c(x) = \ln(1 + \exp^{-x}), x > 0$$

Since this equation is not an approximation, there is no loss of information when use is made of the Jacobian logarithm and additions, instead of multiplications.

In summary, it can also be stated that the decoding is carried out on the basis of a calculation concerning probabilities related to the states of the encoder, using a metric consisting both of a Euclidian distance calculation and the information obtained at the previous iteration. This metric is the term γ defined above.

The states of the encoder are calculated by observing the effects of the previous states on the current state, taking account of the metric, which gives the probabilities α.

Likewise, the states of the encoder are obtained by observing the effects of the subsequent states on the current state, taking account of the metric, which gives the probabilities β.

From these probabilities and the metric, a measurement is obtained which is the log likelihood of the symbol belonging to one or other of the elements of the NRZ alphabet.

With the help of FIGS. 4 and 5, two examples are now described of the embodiment of such a decoder in the prior art, in particular with regard to the calculation of probabilities.

In these figures, the variables α and β designate the probabilities defined above, the variable J designates the Jacobian logarithm and the variable $L_k^e$ is identical to the variable $L^e(u_k)$ defined by equation (8) given above.

The first embodiment of the prior art illustrated in FIG. 4 includes essentially a Jacobian logarithm calculator and three memory registers for storing the results of the calculations corresponding respectively to the three quantities $L_k^e$, $\alpha_k$ and $\beta_{k-1}$.

The second embodiment of the prior art illustrated in FIG. 5 also includes a multiplexer (with appropriate connections) and a state machine controlling this multiplexer.

The prior art precludes the possibility of using the same calculation circuit for the aforementioned three quantities, since equations (11) and (12) given above use neither the same number of operands nor the same states.

SUMMARY OF THE INVENTION

The purpose of the present invention, according to its first aspect, is to afford a solution to the problem of the reduction in the number of logic gates, disclosed in the introduction, by proposing notably a hardware implementation for a decoder of the MAP type, that is to say using the "maximum a posteriori" technique, involving a limited number of logic gates.

For this purpose, according to its first aspect, the present invention proposes a device for estimating a series of symbols, the symbols being related to each other by a parity relationship previously created by an encoder, the estimation taking place through a function having several components performing a calculation of probabilities corresponding to a state of the encoder, these probabilities including:

first probability values, resulting from the observation of the effects of the previous states of the encoder on the current state, second probability values, resulting from the observation of the effects of the subsequent states of the encoder on the current state, and third probability values, representing the belonging of a symbol to a predetermined part of an encoding alphabet, this device having:
a calculation element,
a specific multiplexer,
a unit for controlling this multiplexer, and
a storage module, for storing estimations of the symbols, the multiplexer being controlled by the control unit and adapted to cooperate with the calculation elements so that, not only the first and second probability values, but also the third probability values, are obtained by one and the same circuit from a plurality of predetermined parameters.

It is this use of one and the same circuit for calculating the three types of probability which, by means of a reduction in the number of functions to be implemented, makes it possible to reduce the surface area of silicon used and therefore to reduce the cost of the decoder, whilst if necessary making it possible to miniaturise the product more.

In particular, in the case of an implementation in the form of an ASIC, the invention affords a saving in space and, in the case of an implementation in the form of an FPGA, leaves the possibility of building, if necessary, new functions, not necessarily in relation to the decoder, on the gate structures which will be left free by virtue of the savings made.

Thus the circuitry required for effecting all the operations is minimised, a large number of elementary circuits being reused several times. In addition, it is known that a multiplexer is much simpler to implement than an adder.

In addition, the estimation device according to the first aspect of the present invention has better performance than the implementations of the prior art.

In a particular embodiment of the invention, the unit controlling the multiplexer includes a state machine.

A state machine is a convenient means of modelling conditional concatenations of actions and is particularly adapted to an implementation by FPGA, for example.

The calculation element can in particular be adapted to the calculation of Jacobian logarithms, whose use for the Log-MAP algorithm was described in the introduction.

The result output from a convolutional encoder depends only on the data presented at the input and the state of the encoder. Consequently, it is possible to exhaustively enumerate the states and the way in which they communicate with each other as a function of time This enumeration can be illustrated, in a manner known per se, by a trellis, a diagram consisting of nodes (points representing states of the encoder) and branches (lines representing transitions between nodes).

With each branch, there is associated the value of the data item input and the result output. Whatever the encoder chosen, the pattern of the trellis is repetitive. After a certain amount of time, only the minimum pattern necessary for exhaustive representation is therefore retained as the representation.

According to a particular characteristic of the present invention, the encoder being associated with a predetermined encoding trellis, the estimation device advantageously has means adapted to describe the trellis, not only in the up direction, but also in the down direction.

This artificial creation of two trellises has the advantage of avoiding the systematic exploration of the transitions from one state to all the others and thus affords a gain in processing speed, as well as a saving in the number of memory registers.

The aforementioned trellis description means can include first and second pluralities of tables of dimension M×2, M being the number of possible states of the encoder, said first plurality of tables being adapted to describe the trellis in the up calculation direction, that is to say with a calculation of the probabilities taking account of the influence of the previous state of the encoder on the current state, and said second plurality of tables being adapted to describe the trellis in the down calculation direction, that is to say with a calculation of the probabilities taking account of the influence of the subsequent state of the encoder on the current state.

With each trellis, there is associated the transition, either of the systematic symbol, or of the parity symbol.

Still for the same purpose, according to its first aspect, the present invention also proposes a decoding device including an estimation device as above.

In the application of the invention to the field of turbocodes, this decoding device can include one or more turbodecoders.

For the same purpose as indicated above, according to its first aspect, the present invention also proposes a method of estimating a series of symbols, the symbols being linked together by a parity relationship previously created by an encoder, the estimation taking place by means of a function having several components effecting a calculation of probabilities corresponding to a state of the encoder, these probabilities having:

first probability values, resulting from the observation of the effects of the previous states of the encoder on the current state, second probability values, resulting from the observation of the effects of the subsequent states of the encoder on the current state, and third probability values, representing the belonging of a symbol to a predetermined part of an encoding alphabet, this method including:

at least one calculation step, at least one specific multiplexing step, at least one step controlling the multiplexing step, and at least one storage step, for storing estimations of the symbols, the multiplexing step being controlled by the control step and being combined with the calculation step so that not only the first and second probability values but also the third probability values are obtained by one and the same circuit from a plurality of predetermined parameters.

Still for the same purpose, according to its first aspect, the present invention also proposes a decoding method implementing an estimation method as above.

The particular characteristics and the advantages of the above decoding device, and estimation and decoding methods according to the first aspect of the invention being similar to those of the estimation device according to the first aspect of the invention, they are not repeated here.

Given the recursive character stated in particular in equation (13) above, two structures can appear a priori appropriate to a person skilled in the art to implement the calculation of the Jacobian logarithm. The examples illustrated in FIGS. 18 and 19 are formed on a trellis of 8 nodes and 16 branches.

FIG. 18 shows an example of a calculation of the sum of the Jacobian logarithms in cascade, for an 8-state encoder. A control logic (denoted "CTRL" in FIG. 18) timed by a clock ("CLK") synchronises the use of the calculation units of the Jacobian logarithm ("J"). For i=0, . . . , 7, $\delta_i$ is for example equal to $\alpha_{k-1}(s')+\gamma(s',s)$, or $\beta_{k-1}(s')+\gamma(s,s')$ etc. and $\Delta_8$=ln $(exp^{\delta_0}+exp^{\delta_1}+ \ldots +exp^{\delta_8})$.

This representation has in particular two drawbacks. First of all, M−1 clock beats are required for a decoder having M states to be able to complete the calculations. In addition, the multiplicity of the Jacobian logarithm calculation units results in a high consumption of surface when implementing in the form of an integrated circuit.

The implementation in FIG. 19 tends to dispense with the second drawback.

FIG. 19 shows an example of the calculation of the sum of the Jacobian logarithms in a loop, still in the case of an 8-state encoder. In the drawing, "J" designates the Jacobian logarithm calculation unit, the variables $\delta_i$ for i=0, . . . , 7, and $\Delta_8$ are respectively similar to those of FIG. 18, "MUX1" and "MUX2" designate multiplexers, "CNTR" designates a counter from 0 to 7 which controls MUX1 and MUX2, "CLK" designates a clock and the variables a, b, c and x designate the values output respectively by MUX2, MUX1, J and CNTR.

The multiplexer MUX2 functions as follows:

if the value x supplied by the counter is equal to "00000000" then MUX2 outputs a=$\delta_0$ and MUX1 outputs b=$\delta_1$;

if x="00000001" then a=c and b=$\delta_2$;

if x="00000010" then a=c and b=$\delta_3$;

if x="00000100" then a=c and b=$\delta_4$; and so on.

It can be seen that this solution, unlike that of FIG. 18, includes only one Jacobian logarithm calculation structure. It therefore does not have the drawback of the design of FIG. 18 with regard to the occupation of surface on an integrated circuit.

However, this solution does not per se form any remedy to the aforementioned problem of the degradation of performance due to quantisation.

A data transmission system can generally be shown diagrammatically as indicated in FIG. 17. A data source supplies symbols to be transmitted, which an encoder (denoted "COD" in FIG. 17) protects, for example by redundancy, against the channel imperfections. A modulator (denoted "MOD") shapes symbols in the manner most suited to the channel constraints At the channel output, a demodulator (denoted "DEMOD") puts the data back in a less constrained form which is more easy to manipulate, and a decoder (denoted "DEC") enables to correct a certain number of errors generally related to the noise introduced into the channel. The well is the final destination of the data.

The present invention finds an application in all data transmission systems where the decoder is used according to the BCJR algorithm.

This decoding algorithm is used mainly in turbo-encoders and is also referred to as MAP (which means "Maximum A Posteriori", as stated above).

In its original form, this algorithm involves many multiplications. Since multiplications are not economic in terms of consumption of logic gates, during the hardware implementation of a decoder, it is generally preferable to use another version of the MAP algorithm, referred to as "Log-MAP", where use is made of logarithms for representing the variables and where the multiplications are replaced by additions.

A first approach of a Log-MAP decoder was described by Steven S. Pietrobon in the document entitled "*Implementation and performance of a serial MAP decoder for use in an Iterative Turbo decoder*", Annals of the IEEE International Symposium on Information Theory, Whistler, B. C., Canada, Sep. 17–22, 1995.

In the Log-MAP, in order to avoid transposition of the variables into their logarithm, the Jacobian logarithm is used, denoted J hereinafter:

$$J(\Delta,\delta)=\ln(e^{\Delta}+e^{\delta})=\max(\Delta,\delta)+f_c(|\Delta-\delta|), \qquad (E1)$$

where $\Delta$ and $\delta$ are the variables in question, e designates the exponential.

max(a,b) designates the function determining the largest of the elements a and b,

|| designates the absolute value and $f_c(x)=\ln(1+e^{-x})$, x>0 is a correction function.

Expression (E1) above is a so-called exact formula, which means that its use, in the Log-MAP technique, does not a priori give rise to any degradation in performance for decoding.

It is also possible to use another version of the MAP algorithm, referred to as "Max-Log-MAP", where simply:

$$\ln(e^{\Delta}+e^{\delta})=\max(\Delta,\delta) \qquad (E2)$$

Nevertheless, this last version a priori gives rise to a degradation in performance.

This is because, during hardware implementation of the decoder, the quantisation necessary to an economic implementation of the decoder gives rise to a result which is not appropriate to the use of the Log-MAP, for reasons which will be disclosed later. There is consequently an interest for the implementation in choosing between the use of the two versions, Log-MAP or Max-Log-MAP, and this at each calculation.

There is known, through the article by J.-F. Cheng and T. Ottosson entitled *"Linearly Approximated Log-MAP Algorithms for Turbo Decoding"*, Annals of the conference "Vehicular Technology" (VTC), Tokyo, May 18, 2000, a decision criterion enabling to choose between the Log-MAP algorithm and the Max-Log-MAP algorithm.

However, this solution presents several drawbacks. In particular, the decision criterion is related to the signal to noise ratio and is complex to use.

The purpose of the present invention is to remedy the aforementioned drawbacks.

It makes it possible to choose, simply and independently of the signal to noise ratio, during decoding, at each occurrence of the determination of the Jacobian logarithm, between the use of the two versions mentioned above of the MAP algorithm, namely, Log-MAP or Max-Log-MAP. The invention relates notably to the decision criterion that governs this choice.

The invention makes it possible notably to determine the sum of the Jacobian logarithms of a set of probabilities associated with nodes of the trellis used in a decoder utilising the maximum a posteriori technique.

For this purpose, according to its second aspect, the present invention proposes a method of estimating a series of symbols, the symbols being linked together by a parity relationship previously created by an encoder, the estimation being effected by a function having several components performing a calculation of probabilities corresponding to a state of the encoder, this method being remarkable in that it includes steps consisting of:

comparing first values of probabilities with a first predetermined threshold value, comparing second values of probabilities with a second predetermined threshold value, and if at least one of the first or second values of probabilities is less than the corresponding first or second predetermined threshold value, modifying at least one of the components of the aforementioned function.

Thus, the invention proposes a decision criterion for choosing to use, as the decoding continues, the Log-MAP technique or the Max-Log-MAP technique, in real time, with a view to the estimation of the symbols received. It subsequently makes it possible to perform a decoding with quantisation whilst preserving good performance.

The invention therefore proposes in general terms an advantageous compromise between, on the one hand, the speed of processing and, on the other hand, size considerations during the implantation, for example in the form of an integrated circuit, of the function of calculating the sum of the Jacobian logarithms.

More particularly, the invention takes into account certain effects of degradation of performance due to the quantisation of the calculations and remedies these.

In a particular embodiment, the aforementioned function, which forms the estimation of the received symbols, represents at least one addition operation, at least one comparison operation and possibly a correction operation consisting of applying a correction factor, possibly zero.

When a first component of this function represents a multiplexing operation and a second component of this function represents a Jacobian logarithm calculation operation, in accordance with the invention, during the modification step, if at least one of the aforementioned first or second probability values is less than the corresponding first or second predetermined threshold value, the second component of the said function is modified.

According to a particular characteristic, the modification step relates to the correction operation. For example, the modification step can consist of eliminating any correction or conversely reestablishing a correction. In other words, there is performed an operation of applying a correction whose value is possibly zero, as a function of the modification made on the estimation function Applying a zero correction amounts to choosing the Max-Log-MAP technique defined above.

Applying a non-zero correction amounts to choosing the Log-MAP technique defined above.

For the same purpose as indicated above, according to its second aspect, the present invention also proposes a decoding method implementing an estimation method as above.

In the application of the invention to the field of turbocodes, this decoding method can include one or more turbodecoding operations.

Still for the same purpose, according to its second aspect, the present invention also proposes a device for estimating a series of symbols, the symbols being linked to each other by a parity relationship previously created by an encoder, the estimation being effected by a function having several components effecting a calculation of probabilities corresponding to a state of the encoder, this device being remarkable in that it has:

a module for comparing first probability values with a first predetermined threshold value, a module for comparing second probability values with a second predetermined threshold value, and a module for modifying at least one of the components of the aforementioned function if at least one of the first or second probability values is less than the corresponding first or second predetermined threshold value.

The estimation devices according to the first and second aspects of the invention can advantageously be implemented by the use of software or hardware tools utilising the VHDL language, a hardware description language for Very High Speed Integrated Circuits ("VHSIC Hardware Description Language").

As a variant, it would of course be possible to use other circuit synthesis tools, such as "Verilog" (registered trademark).

Still for the same purpose, according to its second aspect, the present invention also proposes a decoding device including an estimation device as above.

The decoding devices according to the first and second aspects of the invention can also advantageously be implemented by the use of software or hardware tools utilising the VHDL language.

Still for the same purpose, according to its first and second aspects, the present invention also proposes:

a field programmable gate array or FPGA, including means adapted to implement an estimation method and/or means adapted to implement a decoding method according to the first aspect and/or second aspect as above;

a field programmable gate array or FPGA, including an estimation device and/or a decoding device according to the first aspect and/or second aspect as above;

a programmed logic circuit, having means adapted to implement an estimation method and/or means adapted to implement a decoding method according to the first aspect and/or second aspect as above;

a programmed logic circuit, including an estimation device and/or a decoding device according to the first aspect and/or second aspect as above.

The present invention also relates to a digital signal processing apparatus, having means adapted to implement an estimation method and/or means adapted to implement a decoding method according to the first aspect and/or second aspect as above.

The present invention also relates to a digital signal processing apparatus, having an estimation device and/or a decoding device according to the first aspect and/or second aspect as above.

The present invention also relates to a telecommunications network, including means adapted to implement an estimation method and/or means adapted to implement a decoding method according to the first aspect and/or second aspect as above.

The present invention also relates to a telecommunications network, including an estimation device and/or a decoding device according to the first aspect and/or second aspect as above.

The present invention also relates to a mobile station in a telecommunications network, having means adapted to implement an estimation method and/or means adapted to implement a decoding method according to the first aspect and/or second aspect as above.

The present invention also relates to a mobile station in a telecommunications network, having an estimation device and/or a decoding device according to the first aspect and/or second aspect as above.

The present invention also relates to a base station in a telecommunications network, having means adapted to implement an estimation method and/or means adapted to implement a decoding method according to the first aspect and/or second aspect as above.

The present invention also relates to a base station in a telecommunications network, having an estimation device and/or a decoding device according to the first aspect and/or second aspect as above.

According to its second aspect, the invention also relates to:
- an information storage means which can be read by a computer or a microprocessor storing instructions of a computer program, making it possible to implement an estimation method and/or a decoding method according to the second aspect as above, and
- an information storage means which is removable, partially or totally, and which can be read by a computer or a microprocessor storing instructions of a computer program, making it possible to implement an estimation method and/or a decoding method according to the second aspect as above.

The invention also relates to a computer program product containing sequences of instructions for implementing an estimation method and/or a decoding method according to the second aspect as above.

The particular characteristics and the advantages of the above decoding method, estimation and decoding devices, information storage means and computer program product according to the second aspect of the invention being similar to the particular characteristics and advantages of the estimation method according to the second aspect of the invention, they are not repeated here.

As well, the particular characteristics and the advantages of the different field programmable gate arrays, programmed logic circuits, digital signal processing apparatus, telecommunications networks, mobile stations and base stations being similar to the particular characteristics and advantages of the present invention as mentioned previously, they are not repeated here.

BRIEF DESCRIPTION OF THE DRAWINGS

Other aspects and advantages of the invention will emerge from the following detailed description of preferred embodiments, given by way of non-limitative examples. The description refers to the accompanying drawings, in which.

DETAILED DESCRIPTION OF THE PREFERRED EMBODIMENTS

Figure 1:
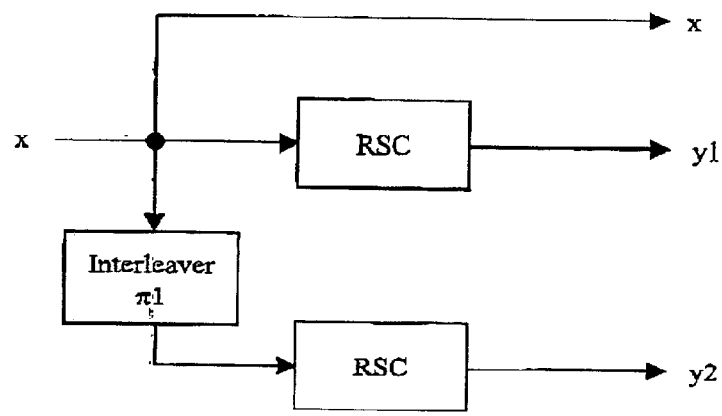
FIG. 1, already described, depicts schematically a conventional turbo-encoder.
Figure 2:
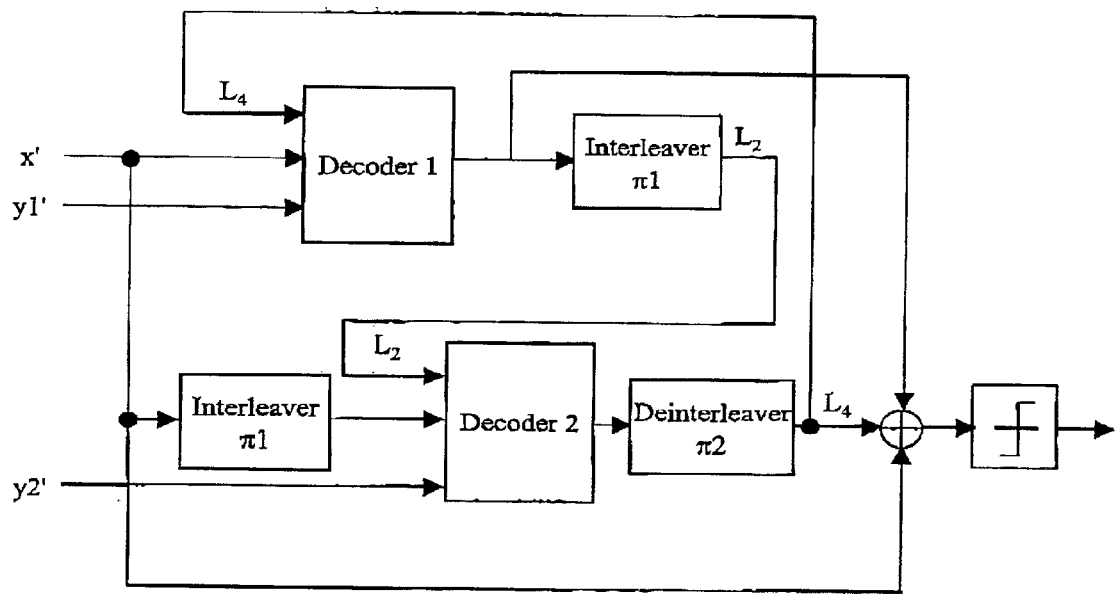
FIG. 2, already described, depicts schematically a conventional turbodecoder.
Figure 3:
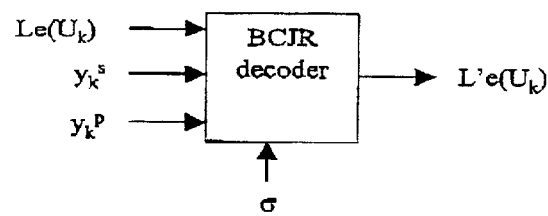
FIG. 3, already described, depicts schematically a conventional MAP decoder.
Figure 4:
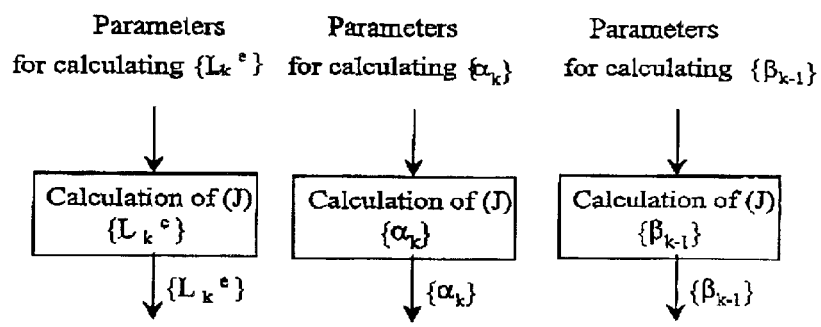
FIG. 4, already described, illustrates a first embodiment of the calculation of probabilities according to the prior art.
Figure 5:
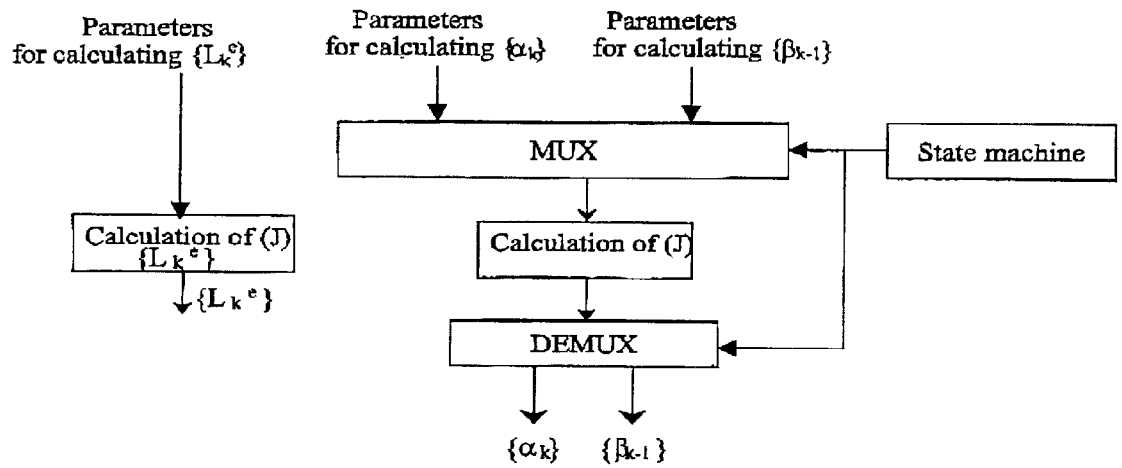
FIG. 5, already described, illustrates a second embodiment of the calculation of probabilities according to the prior art.
Figure 6:
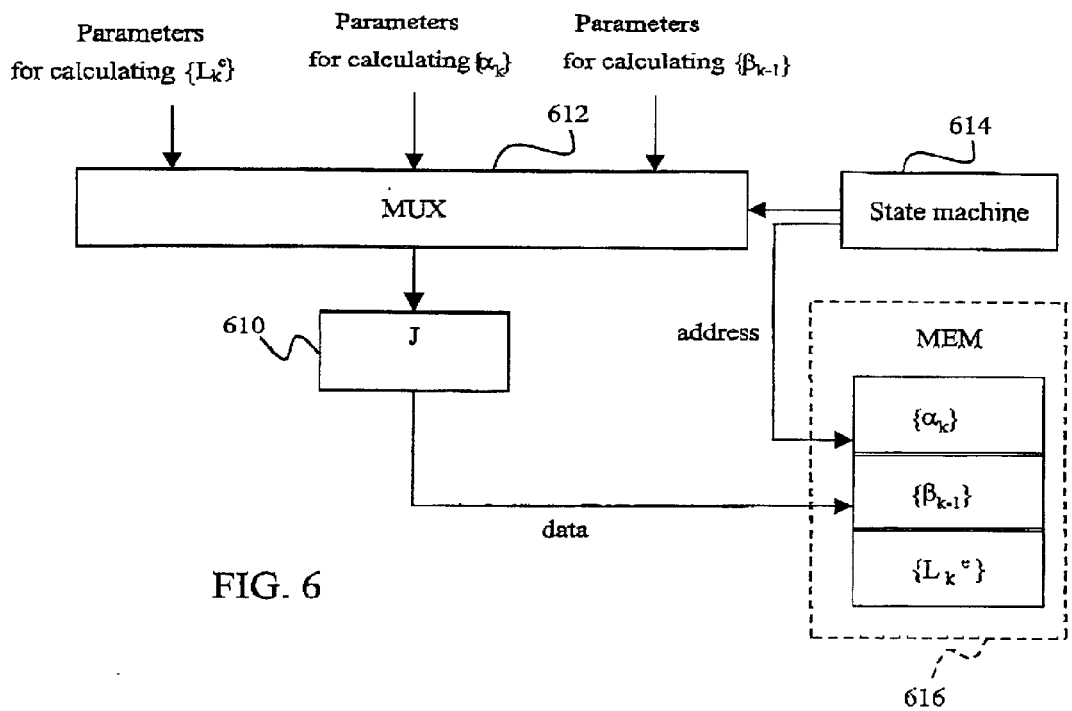
FIG. 6 is a block diagram illustrating the calculation of the probabilities in an estimation device according to the first aspect of the present invention, in a particular embodiment.

In the particular embodiment in FIG. 6, an estimation device according to the first aspect of the invention includes:

a calculation element 610, a multiplexer 612, a state machine 614, and a memory 616.

The multiplexer 612 receives as an input the parameters necessary for calculating the three types of probabilities defined in the introduction, namely:

the probabilities of type α, resulting from the observation of the effects of the previous states on the current state of the encoder, the probabilities of type β, resulting from the observation of the effects of the subsequent states on the current state of the encoder, and the probabilities of the log likelihood type $L_k^e$, representing the belonging of a received symbol to a predetermined part of an encoding alphabet (namely, for example, −1 or +1 if the alphabet used is the NRZ alphabet).

The multiplexer 612 is controlled by the state machine 614, which also supplies, for example in the form of an address pointer, information relating to a location in the memory 616.

The output of the multiplexer 612 is connected to the input of the calculation element 610; which makes it possible notably to calculate the Jacobian logarithms mentioned in the introduction.

The data delivered by the calculation element 610 are supplied to the memory 616, which has for example three registers adapted to the respective storing of the α, β and $L_k^e$.

In FIG. 6, the demultiplexer is represented by the memory 616, whose data come from the calculation element 610 and whose addresses come from the state machine 614.

There is now given, for a better understanding of the present invention, descriptive elements relating to the effect of quantisation on the calculation of the Jacobian logarithm.

The algorithm for calculating the Jacobian logarithm is exact on real numbers. However, real numbers cannot be used in logic circuits which it is sought to simplify to the maximum possible extent; a binary representation is adopted.

Whatever the values: of the inputs of the decoder, their representations will advantageously, even at the cost of a loss of information, be encoded in a restricted number of binary elements.

In the preferred embodiments described here, it is chosen to encode numbers in q bits (q being an integer greater than 1), where the most significant bit (MSB) indicates the sign (this format is called "q bits signed").

This choice is however not limitative: a more restricted number of bits can be chosen (to the detriment however of the precision and therefore of the performance of the decoder).

The encoding system entails a limited number of possibilities of representation: $2^q$ possibilities from $-2^{q-1}$ to $+2^{q-1}-1$ (e.g. from −128 to +127 if q=8).

The different incoming and outgoing elements of the encoder are therefore projected onto this base from $-2^{q-1}$ to $+2^{q-1}-1$.

The outputs of the encoders are the extrinsic informations, which represent a data likelihood logarithm. For convenience, it is decided to use the values from $-2^{q-1}$ to $+2^{q-1}-1$. There is saturation for values greater than $+2^{q-1}-1$ and less than $-2^{q-1}$, and truncation if the result of the calculations implies the existence of a non-integer value.

In the non-limitative examples described here, it is assumed that the inputs of the encoder are values belonging to the set {−1, +1}, affected by noise. They can therefore theoretically take any value on the set of real numbers. Nevertheless, in the hypothesis of a white Gaussian noise, the very high values are rare and it is possible to saturate at +16 if the value of the symbol or of the received parity affected by the Gaussian noise is greater than 16, and −16 if this value is less than −16. The saturation value +16 will be represented by $2^{q-1}-1$ (e.g. by +127 if q=8) for the calculations and the saturation value −16, by $-2^{q-1}$ (e.g. by −128 if q=8).

The first effect of this quantisation is to introduce a change of base in the calculation. It is in fact less advantageous, since less suited to the present invention, to use natural logarithms than logarithms to the base s.

The value of ϵ is obtained by choosing the minimum step able to be represented, that is to say here $16/(2^{q-1}-1)$, that is to say 0.125 in the in no way limitative example where q=8. The calculation base is the exponential of 0.125, that is to say 1.13, so that there is obtained a correspondence of log(ϵ) with 0.125.

The entire decoder therefore works solely with words to the format q bits signed, which represent logarithms to the base $$\exp\left(\frac{16}{2^{q-1}-1}\right).$$

This modification is known to persons skilled in the art and was described by Steven S. Pietrobon, more specifically for a Log-MAP decoder, in the document already cited.

Thus, the calculation of the Jacobian logarithm, which was based on the following recursion formula:

$\Delta_i = \ln(\exp^{\Delta_{i-1}} + \exp^{\delta_i}) = \max(\Delta_{i-1}, \delta_i) + f_c(|\Delta_{i-1} - \delta_i|)$ with $\Delta_1 = \ln(\exp^{\delta_1}) = \delta_1$ and $f_c(x) = \ln(1+\exp^{-x}), x>0$ becomes:

$$\Delta_i = \log_e(\epsilon^{\Delta_{i-1}} + \epsilon^{\delta_i}) = \max(\Delta_{i-1}, \delta_i) + f_c(|\Delta_{i-1}\delta_i|)$$

with $$\Delta_1 = \log_e(\epsilon^{\delta_1}) = \delta_1$$

and $$f_c(x) = \log_e(1 + \epsilon^{-x}), x > 0$$

Through the formula of change of base, it is easy to find:

$$f_c(x) = \frac{1}{\ln \varepsilon} \ln(1 + e^{-x \cdot \ln \varepsilon}), x > 0$$

A particular embodiment of the decoder function according to the first aspect of the invention is now described.

General Architecture

The decoder is designed so as to take into account useful data frames of length N (it can also be said that the number of systematic symbols is N).

Figure 7:
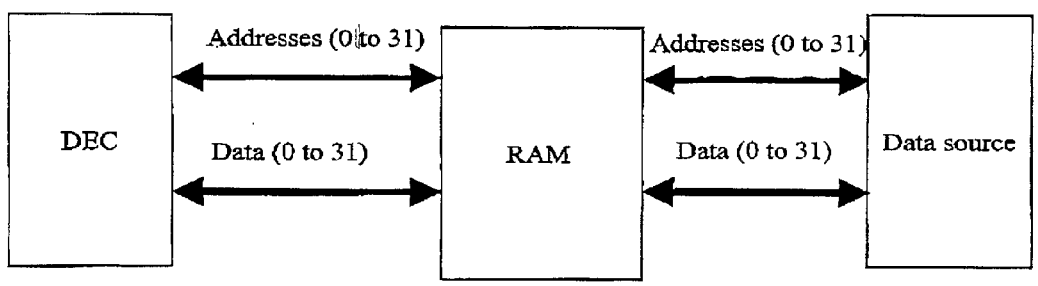
FIG. 7 illustrates schematically the general architecture of an estimation device according to the first aspect of the present invention, in a particular embodiment.

As shown in FIG. 7, the decoder advantageously has a double access RAM memory and an electronic decoding circuit, for example of the FPGA type.

As a variant, it is of course possible to use an ASIC circuit or, in general terms, hard-wired logic. The double access memory can also be integrated into the FPGA or the ASIC.

Instead of a double access memory, it is possible to use a single access RAM memory with access arbitration.

In this particular embodiment, only the MAP decoder function is implemented in hardware form; the interleaving and final decision functions are implemented in software form. Two decoding operations are performed at each turbodecoding iteration.

Figure 8:
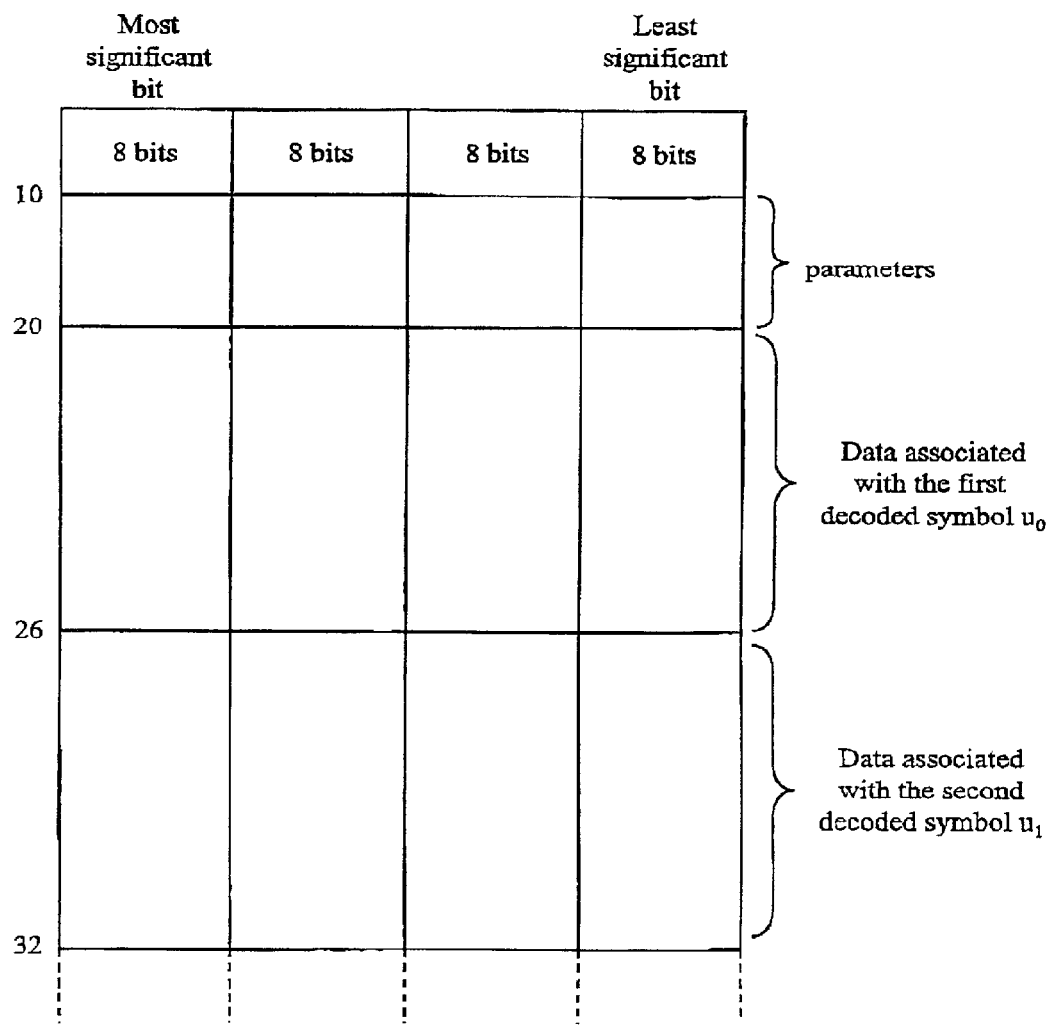
FIG. 8 is a table showing diagrammatically an example, in no way limitative, of the organisation of a memory included in the estimation device of FIG. 7.

An example of organisation of the RAM memory is illustrated in FIG. 8 for an 8-state encoder, as an indication and in no way limitatively. The possibilities of arrangement are many.

The useful parameters stored at the addresses 10 to 20 are for example the length N of the frame and/or information indicating whether or not the trellis is terminated.

Engine for Calculating the Metric

The calculation of the Euclidian metric is dependent on the states of the encoder. It is described below in relation to the use of the trellis tables Uk_f, Uk_b and Xp_f and Xp_b, also defined below. Let Lc_Ys/2 be the quantity equivalent to the value of the systematic data item received $y_k^s$ multiplied by the signal to noise ratio and divided by 2. Let Le/2 be the extrinsic value related to the input of the encoder at time k. It will be seen that the value obtained by the addition of Lc_Ys/2 and Le/2 has been depicted in the drawings by γε+(k) and that the opposite value has been depicted by γε−(k).

Engine for Calculating the Probabilities Related to the States of the Encoder

In the particular embodiment of the estimation device according to the first aspect of the invention as described here, this engine uses:

six tables of 8-bit internal memory registers, designated by the reference signs temp_i, i=1, . . . , 6. Each table has a depth equal to the number of states of the encoder;

four addition functions in 8 bits in two's complemented logic; these addition functions add elements of the tables of registers temp_i one by one and can include as many groups of four unitary addition elements in 8 bits as there are states of the encoder; and maximum functions, produced by a comparison of the inputs in two's complemented logic; there are as many maximum functions as states of the encoder.

The unitary elements of these last two functions are known to a person skilled in the art and are therefore not detailed here.

Figure 9:
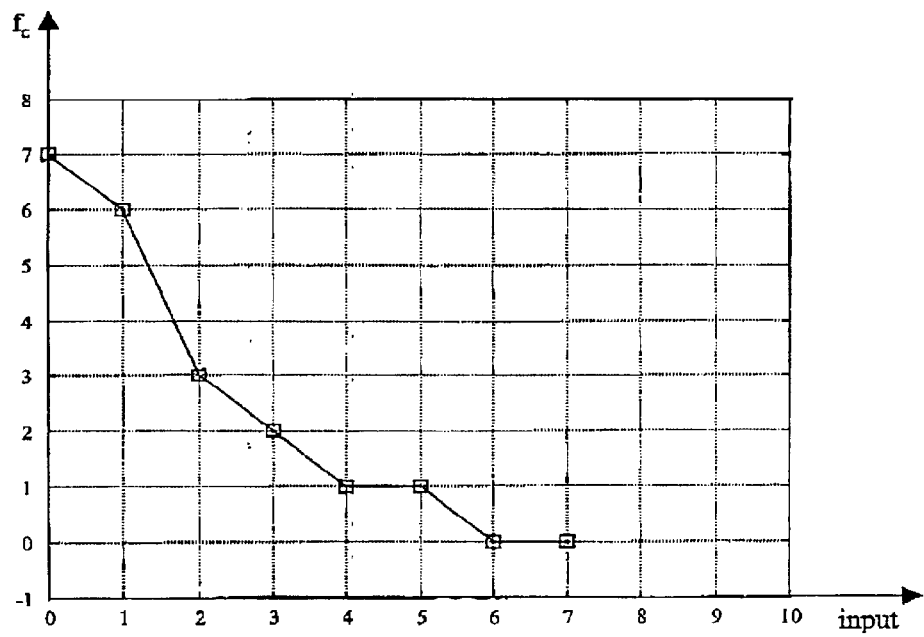
FIG. 9 is a graph illustrating a correction function used by the engine for calculating the probabilities relating to the states of the encoder, in the estimation device of FIG. 7.

The engine for calculating the probabilities relating to the states of the encoder also includes:

an external memory, which contains both the data to be decoded and the calculation parameters;

a state machine, whose running makes it possible to perform the steps depicted in FIG. 10 described below;

six multiplexers, associated one by one with the aforementioned registers; these multiplexers are controlled by the state machine; and a correction function, which is in fact performed by a table of values stored in the internal memory of the decoder; this function is illustrated in FIG. 9.

FIG. 9 thus depicts a choice of discrete values of the correction function, denoted $f_c$, entered on the Y-axis of the curve. The indices of the successive inputs are entered on the X-axis. It will be observed that choosing an always zero value for this correction function, which is equivalent to not applying any correction, amounts to applying the algorithm known as "Max-Log-MAP".

The decoder also has four tables of dimension M×2, M being the number of possible states of the encoder, these tables describe the trellis:

in the up calculation direction (calculation of the probabilities taking account of the influence of the prior state of the encoder on the current state) and in the down calculation direction (calculation of the probabilities taking account of the influence of the subsequent state of the encoder on the current state).

With each trellis there is associated the transition, either of the systematic symbol, or of the parity symbol.

The use of two trellis tables avoids the systematic exploration of the transitions from one state to all the others and increases the calculation speed.

Hereinafter, these tables are called;

Uk_f for the trellis associated with the up direction and corresponding to the systematic symbol, Uk_b for the trellis associated with the down direction and corresponding to the systematic symbol, Xp_f for the trellis associated with the up direction and corresponding to the parity symbol, and Xp_b for the trellis associated with the down direction and corresponding to the parity symbol.

Figure 10:
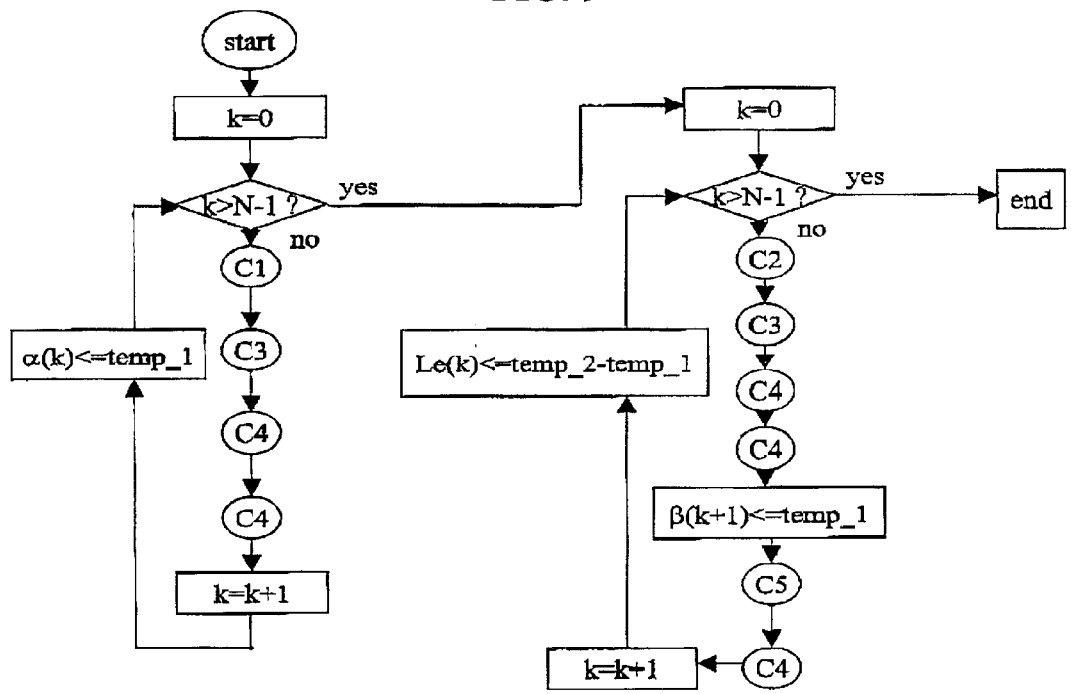
FIG. 10 is a flow diagram illustrating the main state machine included in the estimation device according to the first aspect of the invention, in a particular embodiment.

FIG. 10 depicts the main state machine. This machine generates five signals denoted C1 to C5 (C for condition). These signals represent "triggering"; they are used to validate the connections of the multiplexers which make it possible to store certain values in the registers temp_1 to temp_6 defined above.

The state machine first of all calculates the values associated with the up probabilities and then the values associated with the down probabilities and finally calculates the log likelihood.

The states appear in sequence.

In FIG. 10, the α and β designate the probabilities described previously, the variable N designates the length of the frame processed and the index k is an integer between 0 and N which designates a counter, incremented a certain number of times (event "k=k+1").

Figure 11:
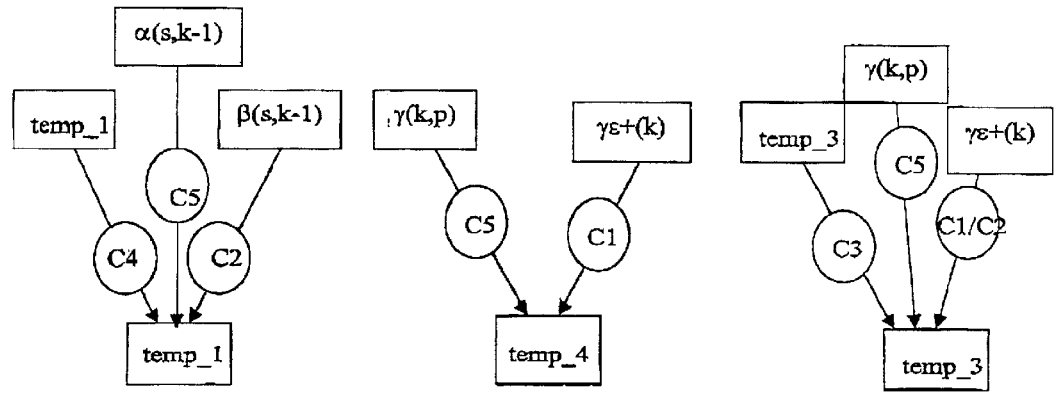
FIG. 11 is a flow diagram illustrating a first group of elementary multiplexers included in the estimation device according to the first aspect of the invention, in the embodiment in FIG. 10.

FIG. 11 illustrates the first three multiplexers which address the tables in registers temp_1, temp_3 and temp_4.

When the condition is validated by the state machine, the corresponding value is stored in the register.

Thus, when, for example the signal C5 is generated by the state machine, the register table temp_1 will contain all the M elements α stored by the double access memory (see FIG. 7 described above) at the address (N−1).

Figure 12:
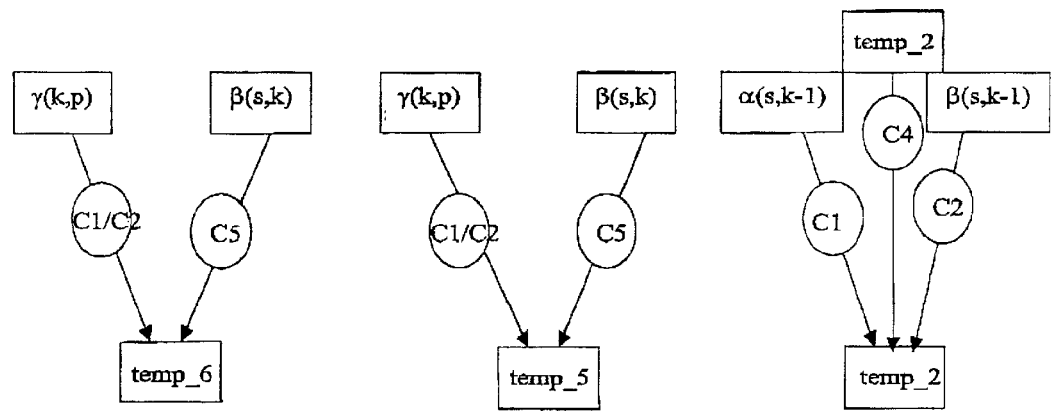
FIG. 12 is a flow diagram illustrating a second group of elementary multiplexers included in the estimation device according to the first aspect of the invention, in the embodiment in FIG. 10.

In a similar manner, FIG. 12 illustrates the three multiplexers corresponding to the register tables temp_6, temp_5 and temp_2.

Figure 13:
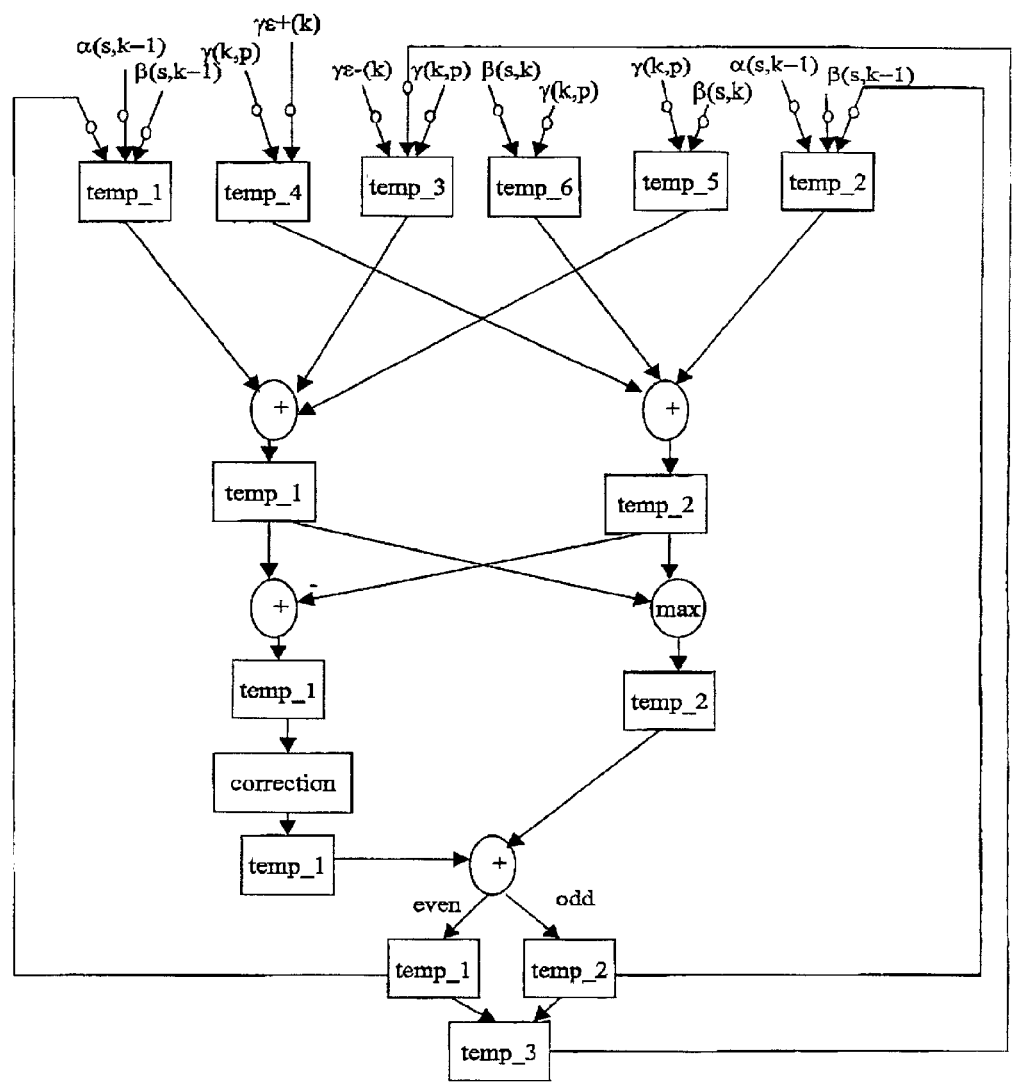
FIG. 13 is a flow diagram illustrating the architecture of the engine for calculating probabilities in the estimation device according to the first aspect of the present invention, in a particular embodiment.

FIG. 13 describes the operations performed between each change of state. To simplify, in FIG. 13, conditions C1 to C5 are solely represented by dots. For more details, reference can be made to FIGS. 11 and 12.

The results of the additions made one by one between the register tables temp_1, temp_3 and temp_5, and the results of the additions performed one by one between the register tables temp_2, temp_4 and temp_6 are stored in the tables temp_1 and temp_2 respectively.

At the following steps the registers temp_2 receive the results of the operations of determining the maximum of two values, performed element by element, on the content of the registers temp_1 and temp_2, whilst the registers temp_1 receive the result of the subtractions, element by element, of the registers temp_2 from the registers temp_1.

As shown in FIG. 13, the values of the registers temp_1 then constitute the input of a correction table for the correction function $f_c$ defined previously. The outputs are once again stored in the registers temp_1.

The values contained in the registers temp_1 and the registers temp_2 are once again added and the results of these additions are broken down in the registers temp_1 or temp_2 according to the parity of their address in the table.

Thus the result of temp_1(0)+temp_2(0) is written in temp_1(0), whilst temp_2(0) receives the result of the addition of temp_1(1) and temp_2(1), and so on.

In the same way, temp_3 receives the registers temp_1 and temp—2:

temp_3(0) is updated with temp_1(0),
temp_3(1) is updated with temp_2(0),
temp_3(2) is updated with temp_1(1),
temp_3(3) is updated with temp_2(1), etc.

Use of the Trellis Tables Uk_f, Uk_b, Xp_f and Xp_b

γ(k,s) represents a value which is obtained in fact by comparing the tables related to the states s.

As seen in the introduction (equations (11)), $$\overline{\gamma}_k(s', s) \sim \frac{1}{2} u_k(L^e(u_k) + L_c y_k^s) + \overline{\gamma}_k^e(s', s)$$

$$\overline{\gamma}_k^e(s', s) \triangleq \ln(\gamma_k^e(s', s)) = \frac{1}{2} L_c y_k^p x_k^p \text{ and } L_c \triangleq \frac{4E_c}{N_0}$$

Advantageously $u_k$ and $x_k^p$ are replaced by their algebraic value, which is equal either to +1 or −1, and there is substituted, for the multiplication of these values with the systematic and parity values received, a comparison between the two trellis tables, so as to derive therefrom the correct result. Use is therefore made of the value Lc_Yp/2, which is the received value of the parity symbol, standardised by an estimation of the noise, or its opposite −Lc_Yp/2, instead of γ(k,s). The choice of the sign is determined by the comparison of the trellis tables with the value of s' as the input. This value of s' is none other than the index of the register table.

Figure 14:
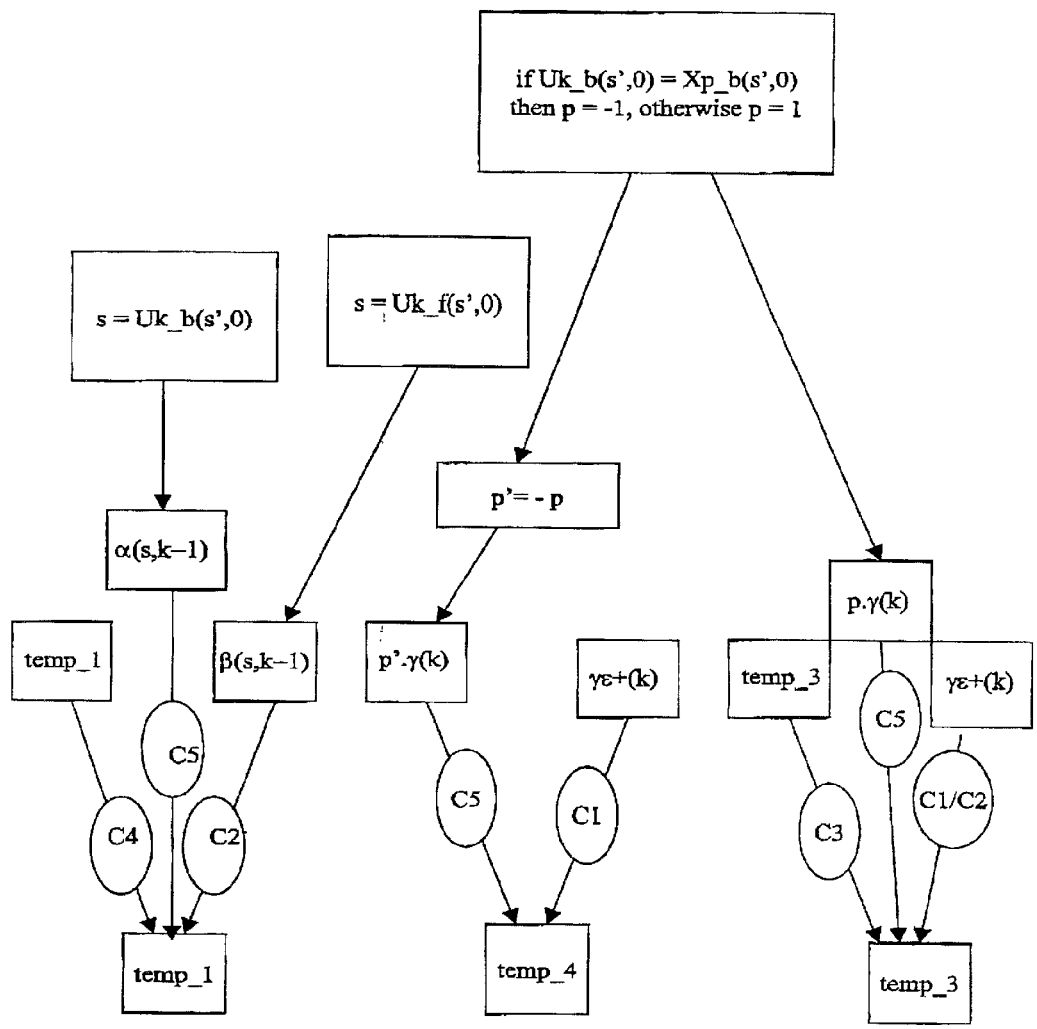
FIGS. 14 and 15 are flow diagrams illustrating the use of the trellis tables in the estimation device according to the first aspect of the invention, in a particular embodiment.
Figure 15:
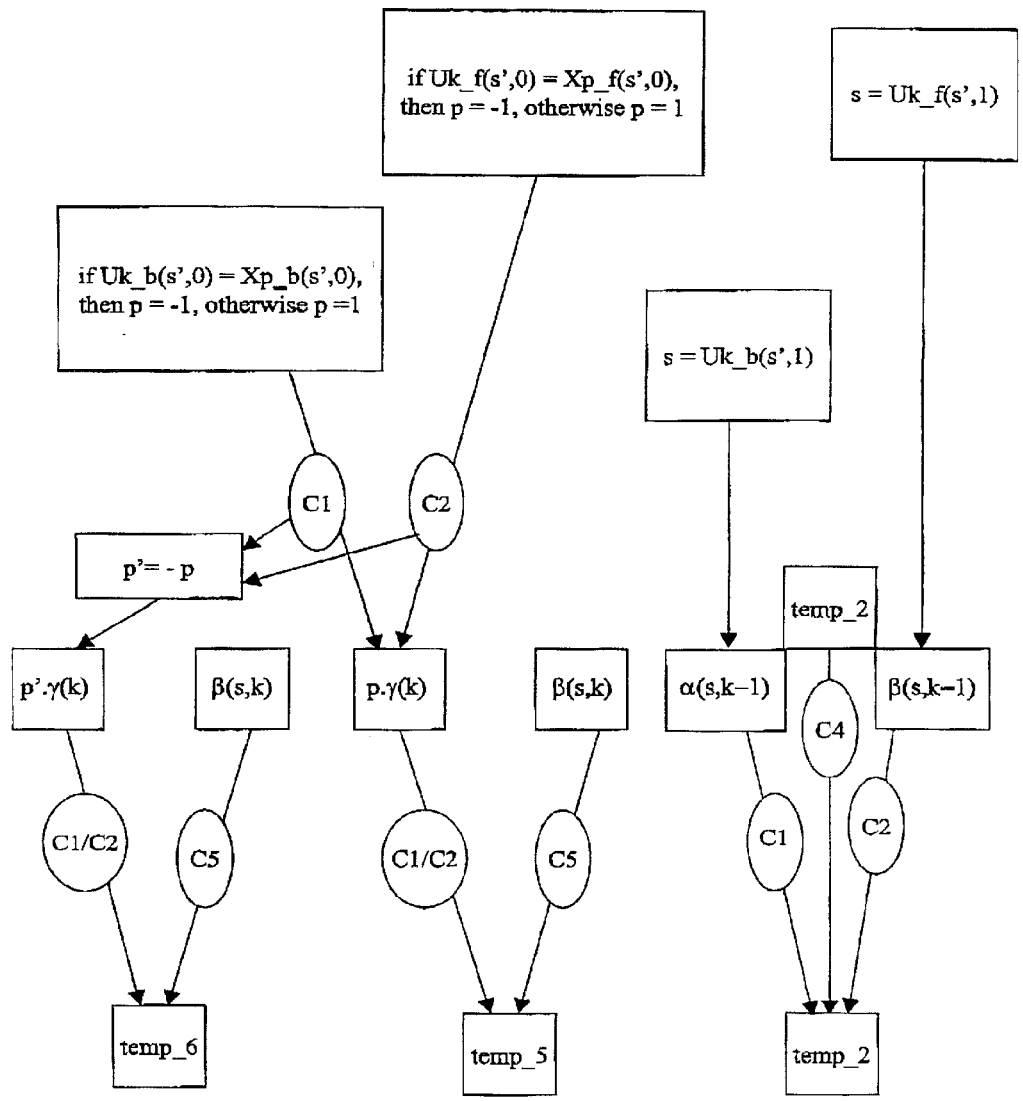

Thus one calculation is dispensed with, which results in a saving in the number of logic gates in the implementation Thus, for example, at the $k^{th}$ iteration, the register temp_5 will record the value −γ(k) if Uk_b(k,0) is equal to Xp_b (k,0) and will record the value γ(k) in the contrary case. This process is illustrated in FIGS. 14 and 15.

Likewise, the value of s, which determines the register to be stored at steps or conditions C1, C2 and C5, is determined by the trellis.

An example of the trellis tables is given in Tables 1 to 4 below, for an RSC encoder defined by:

$$h(x)=1+x+x^3 \equiv 1101=13$$

$$g(x)=1+x^2+x^3 \equiv 1011=11.$$

where h(x) and g(x) designate the generator polynomials of the encoder, respectively multiplier and divisor.

In Tables 1 to 4, s' designates the state at time (n−1) and s designates the state at time (n).

Table 1 below is the table Xp_b of the trellis in the up direction, associated with the first parity of the RSC encoder:

TABLE 1

| s' | s if parity = −1 | s if parity = +1 |
|----|------------------|------------------|
| 0  | 0                | 1                |
| 1  | 2                | 3                |
| 2  | 5                | 4                |
| 3  | 7                | 6                |
| 4  | 1                | 0                |
| 5  | 3                | 2                |
| 6  | 4                | 5                |
| 7  | 6                | 7                |

Table 2 below is the table Xp_f of the trellis in the down direction, associated with the first parity of the RSC encoder:

TABLE 2

| s' | s if parity = −1 | s if parity = +1 |
|----|------------------|------------------|
| 0  | 0                | 4                |
| 1  | 4                | 0                |
| 2  | 1                | 5                |
| 3  | 5                | 1                |
| 4  | 6                | 2                |
| 5  | 2                | 6                |
| 6  | 7                | 3                |
| 7  | 3                | 7                |

Table 3 below is the table Uk_f of the trellis in the up direction, associated with the systematic symbol;

TABLE 3

| s' | s if symbol = −1 | s if symbol = +1 |
|----|------------------|------------------|
| 0  | 0                | 1                |
| 1  | 3                | 2                |
| 2  | 4                | 5                |
| 3  | 7                | 6                |
| 4  | 1                | 0                |
| 5  | 2                | 3                |
| 6  | 5                | 4                |
| 7  | 6                | 7                |

Table 4 below is the table Uk_b of the trellis in the down direction, associated the systematic symbol:

TABLE 4

| s' | s if parity = −1 | s if parity = +1 |
|----|------------------|------------------|
| 0  | 0                | 4                |
| 1  | 4                | 0                |

TABLE 4-continued

| s' | s if parity = −1 | s if parity = +1 |
|---|---|---|
| 2 | 5 | 1 |
| 3 | 1 | 5 |
| 4 | 2 | 6 |
| 5 | 6 | 2 |
| 6 | 7 | 3 |
| 7 | 3 | 7 |

Figure 16:
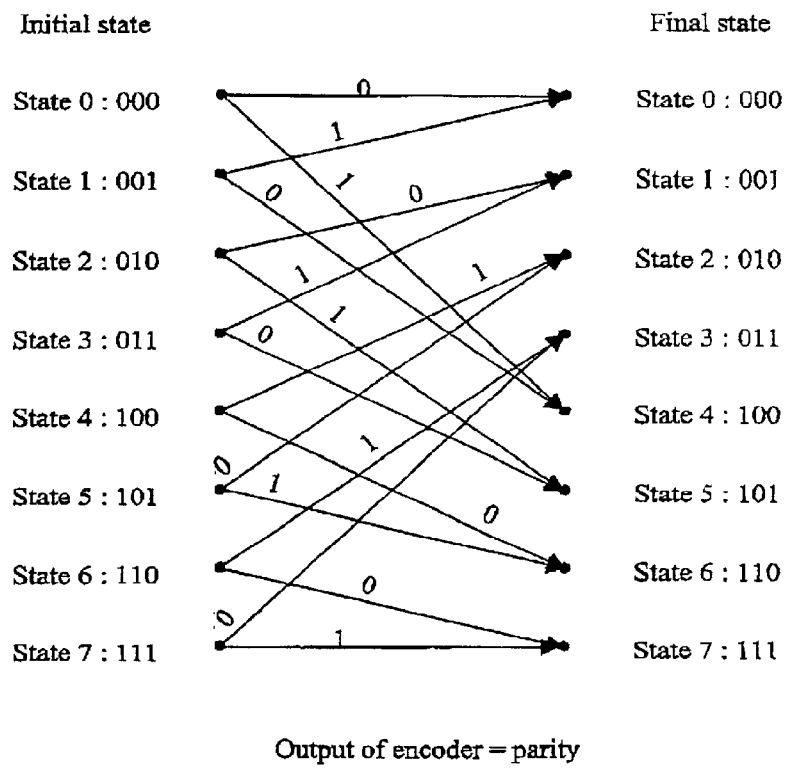
FIG. 16 is a representation of an encoding trellis associated with the first parity of the encoder, in the up direction.
Figure 17:
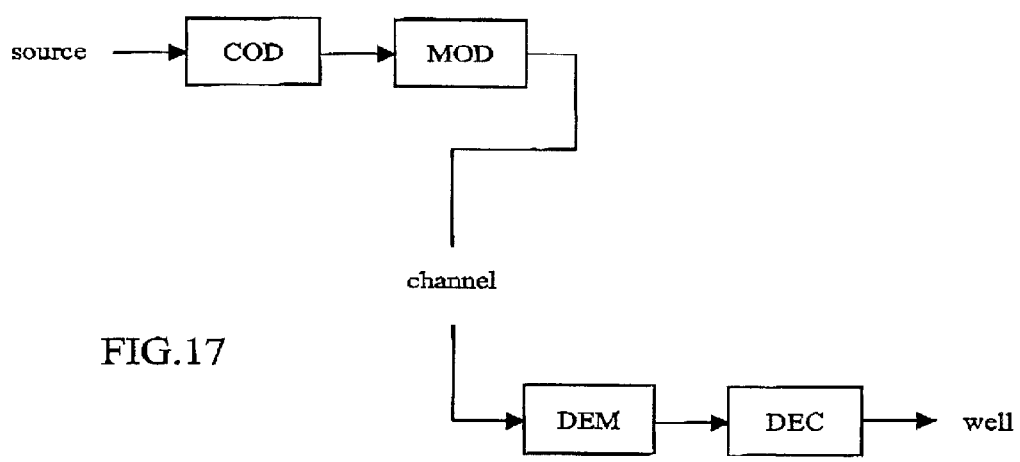
FIG. 17, already described, illustrates the general diagram of a conventional transmission system.

To illustrate the correspondence between table and trellis, the trellis corresponding to the up direction for the parity is illustrated in FIG. 16. The other trellises are easily derived, either starting from the generator polynomial, or starting from the tables. The trellis corresponding to Xp_f is derived from the trellis in FIG. 16 by reading in the other direction, as indicated previously.

The components necessary for implementing the functions which have just been described are comparators and inverters, well known to a person skilled in the art. The trellis tables are derived from the encoder in a simple manner, obvious to a person skilled in the art.

Moreover, it has been seen that, by virtue of the present invention in its first aspect, the same circuits supply the calculation not only of the values of the probabilities α and β, but also of the values of the log likelihood Le.

The above-mentioned problem related to quantisation is now explained in more details, in connection with the second aspect of the invention.

When the correction function $f_c$ is applied to operands to the format 8 bits signed, it is found that, for a zero difference, that is to say two equal operands, it is necessary to add, to the largest of the two operands, a correction equal to the value obtained by the correction function, that is to say for example 5.

If the value of the operand is −128, that is to say the saturation value, the result of the Jacobian logarithm is then −122. Thus, performing the operation of the saturation value gives not the saturation value, but a larger value.

The problem can be perceived easily on the first decoding of the first iteration. In order to calculate the probability of a state, account is taken of its M predecessors or of its M immediately following ones, M being the number of possible states of the encoder.

In the non-limitative example of an 8-state encoder, at the start of the operations, there are 2 possible states and 6 with probability zero and which have therefore the value −128 as a representation of this probability. There are therefore three additions, then two, and then one where this value of −128 should give −128 as the result. In fact, here, there is obtained on the first rank −122, then −118, and then −113. It is in principle necessary to add the minimum value −128 to the probability values of the two possible states; however, the value of −113 will be added here. There is therefore a cumulative error on the representation of the lowest probability.

The process being recursive, the error propagates in the recursions and the minimum value −128 is moved away from fairly rapidly during the many operations. This difference, which propagates in the decoder, will falsify the calculations and therefore degrade the performance.

It should be noted that this situation where two equal operands representing a very low probability are to be added is very usual, in particular in calculations with a high; signal to noise ratio.

In accordance with the second aspect of the invention, it is proposed not to make the correction when the value of one or other of the operands, i.e. of the probabilities, is less than a predetermined threshold value. By way of in no way limitative example, the threshold t=−100 can be taken. This simple modification gives rise to an improvement by a factor of 2 of the performance with a low signal to noise ratio.

Figure 20:
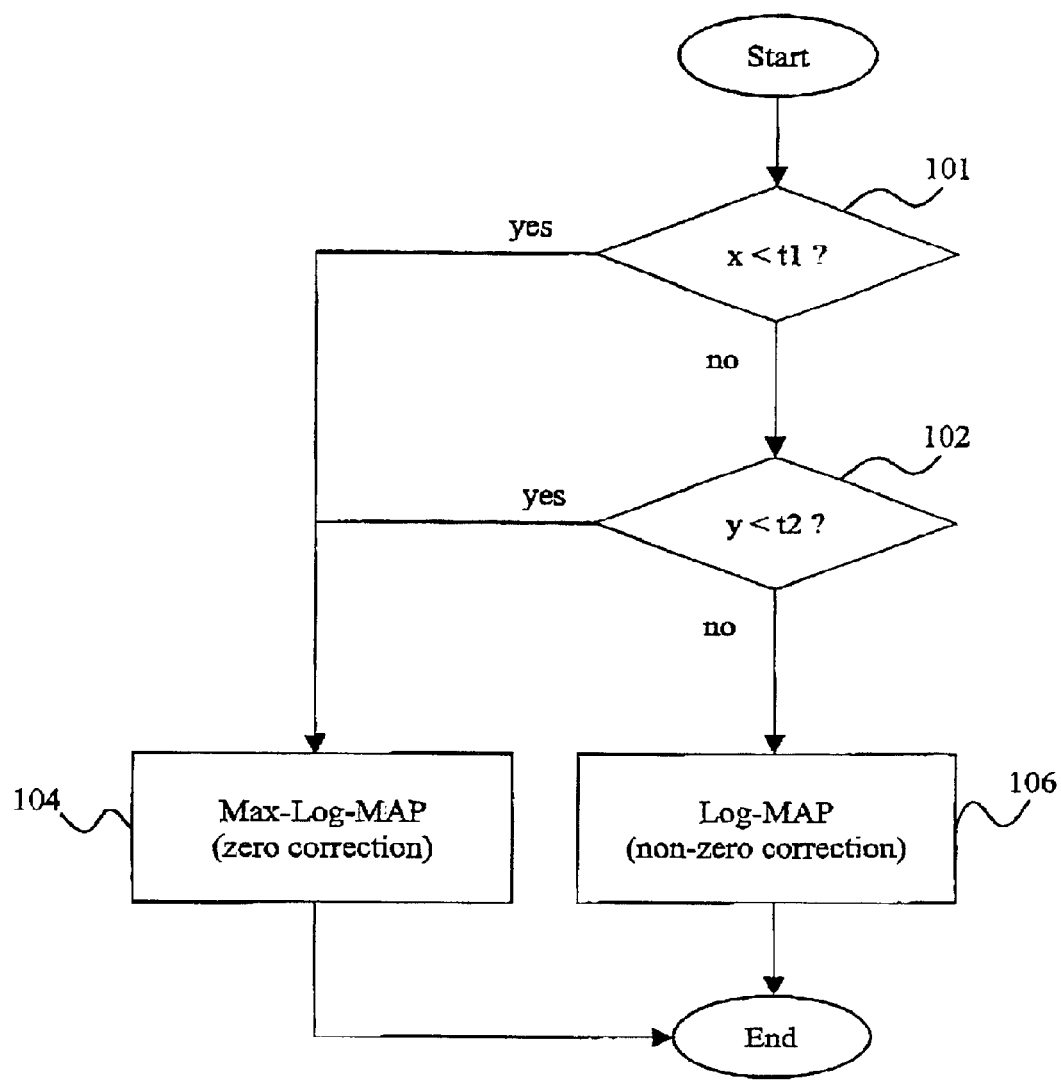
FIG. 20 is a flow diagram illustrating the main steps of an estimation method according to the second aspect of the present invention, in a particular embodiment.

The flow diagram in FIG. 20 illustrates the estimation method according to the second aspect of the invention and more particularly the Jacobian logarithm determination phase.

During a first comparison step 101, it is tested whether the operand x, which is a probability value, is less than a first predetermined threshold value t1.

If such is the case; during a step 104, the Max-Log-MAP technique is applied, that is to say a zero correction $f_c$ is applied (in other words, no correction).

If such is not the case, that is to say if x>t1, it is tested, during a second comparison step 102, whether the operand y, which is also a probability value, is less than a second predetermined threshold value t2. It is if necessary possible to use t1=t2.

If such is the case, during a step 106, the Log-MAP technique is applied, that is to say a non-zero correction $f_c$ is applied.

Figure 21:
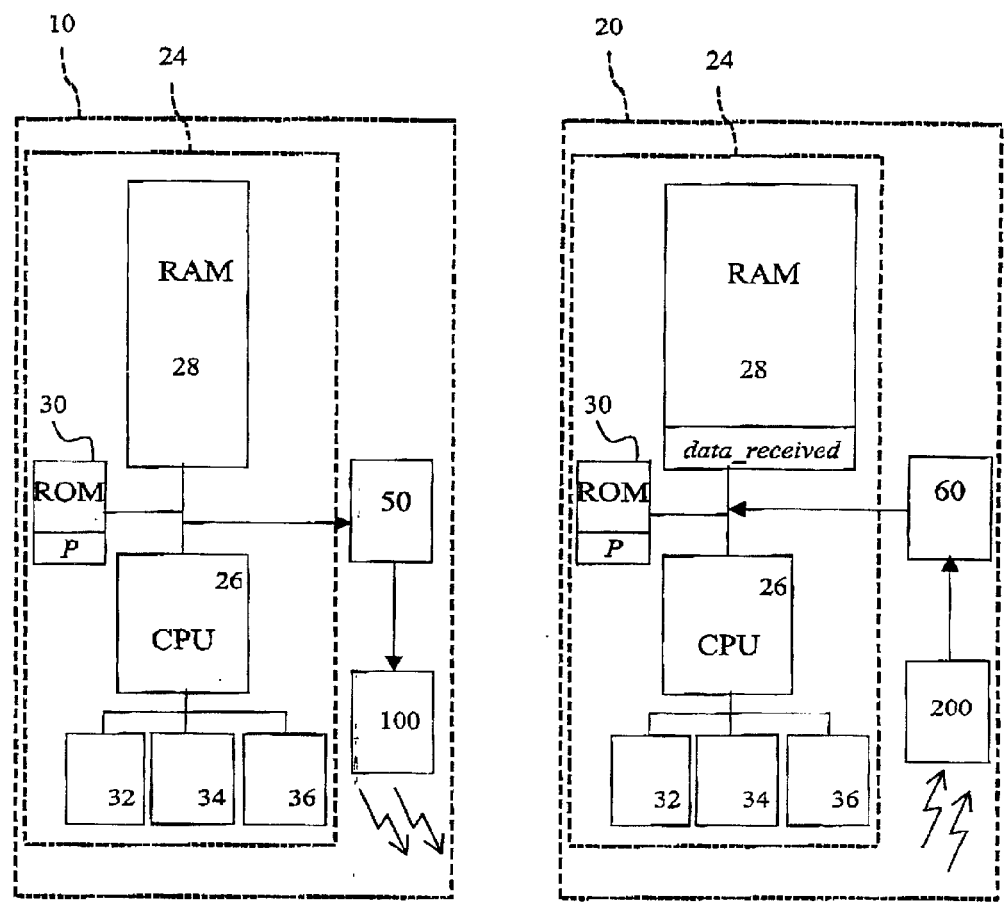
FIG. 21 illustrates schematically a first application of the second aspect of the invention, of the hardware type, in a particular embodiment.
Figure 22:
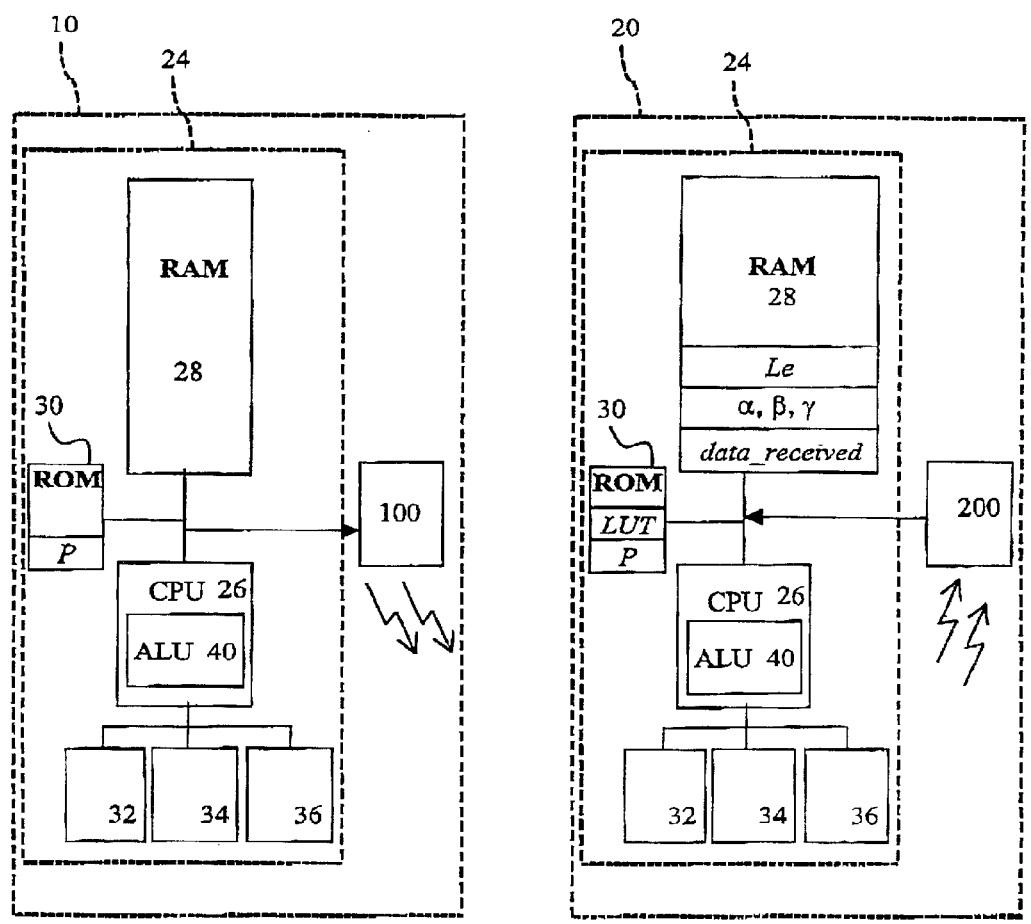
FIG. 22 illustrates schematically a second application of the second aspect of the invention, of the software type, in a particular embodiment.

FIGS. 21 and 22 each represent a transmission device 10 and a reception device 20, in a hardware application of the second aspect of the invention in FIG. 21, respectively a software application in FIG. 22. The transmission between the devices 10 and 20 can be effected by any means judged appropriate such as by wire, radio or other.

The four devices include a data processing unit 24. The data processing unit 24 includes:
- a calculation unit CPU ("Central Processing Unit") 26,
- a temporary data storage means (RAM memory) 28,
- a storage means (ROM memory) 30,
- character entry means 32, such as for example a keyboard,
- image reproduction means 34 such as, for example, a screen, and
- input/output means 36 (affording for example connection to the Internet and/or to a camera etc.).

The calculation unit 26 is adapted to implement notably the implementations illustrated by FIGS. 23a, 23b, 24, 25a and 25b described below and/or the flow diagram of FIG. 20.

In FIGS. 21 and 22, the transmission device 10 includes a transmitter 100 and the reception, device 20 includes a receiver 200.

The RAM memory 28 of the reception device 20 contains data, variables and intermediate processing results, in memory registers bearing, in the description, the same names as the data whose values they store. The word "register" used here designates, in each of the memories 28 and 30, both a memory area of low capacity (a few binary data) and a memory area of large capacity (making it possible to store an entire program).

The RAM memory 28 of the reception device 20 contains notably:
- a register "data_received", in which there are stored the binary data received coming from the transmission channel.

In the software embodiment of FIG. 22, the RAM memory 28 of the reception device 20 also contains:
- registers "Le" and "α, β, γ", in which there are stored the data necessary for decoding.

The ROM memory 30 of the transmission 10 and reception 20 devices contains notably:
- a register "P", in which there is stored the operating program of the calculation unit 26.

In the software embodiment mode of FIG. 22, the ROM memory 30 of the reception device 20 also contains:
 a register "LUT", in which there is stored a look-up table 15, described below in relation to FIG. 23.

In FIG. 21, the transmission device 10 includes an encoding module 50. In a particular embodiment, the encoding module 50 includes a turbo-encoder or a convolutional encoder. The reception device 20 contains a decoding module 60. The decoding module 60 is likely to use hardware elements and logic gates described in more detail below.

In FIG. 22, the two calculation units 26 also include an Arithmetic and Logic Unit 40 (ALU).

Figure 19:
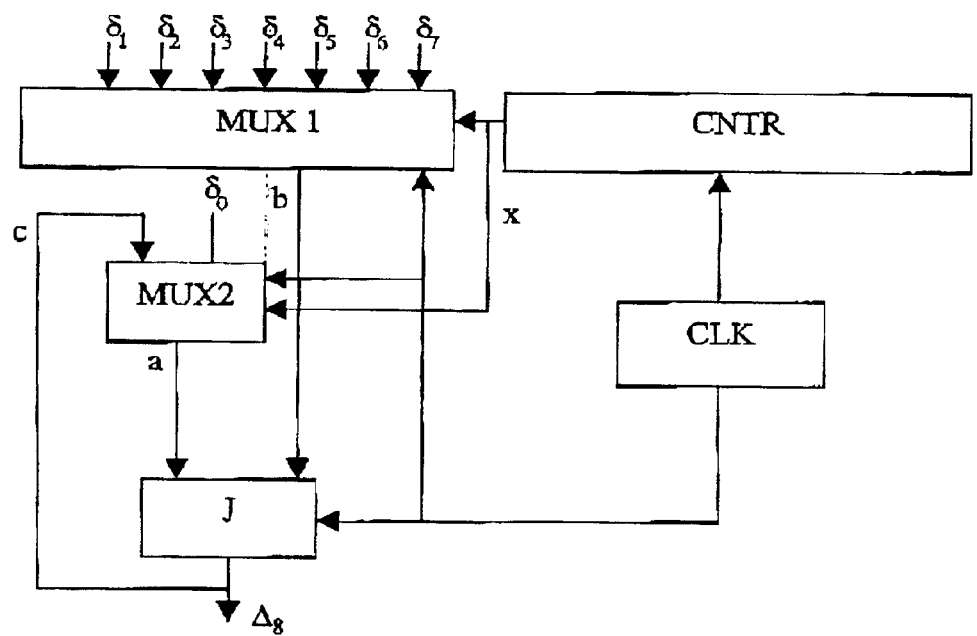
FIG. 19, already described, illustrates an example of calculation of the sum of Jacobian logarithms in a loop, for an 8-state encoder.

A fixed-point ALU will advantageously be chosen, of the type contained in a certain number of Digital Signal Processors (DSP). In this case, implementation of the calculation of the Jacobian logarithm can advantageously be effected by a programming using the implementation of FIG. 19 and combining it with the steps of the estimation method according to the second aspect of the invention; the implementation of FIG. 19 is in fact more suited to a software implementation.

This type of implementation is particularly appropriate for an application of the present invention to the reception of data in wireless telecommunications appliances of so-called "third generation" or IMT 2000 implementing the standard UMTS-3GPP.

A description is now given in more detail, in relation to FIGS. 23a, 23b, 24, 25a and 25b, of the hardware elements and logic gates likely to be used by the decoding module 60 illustrated in FIG. 21.

Figure 23A:
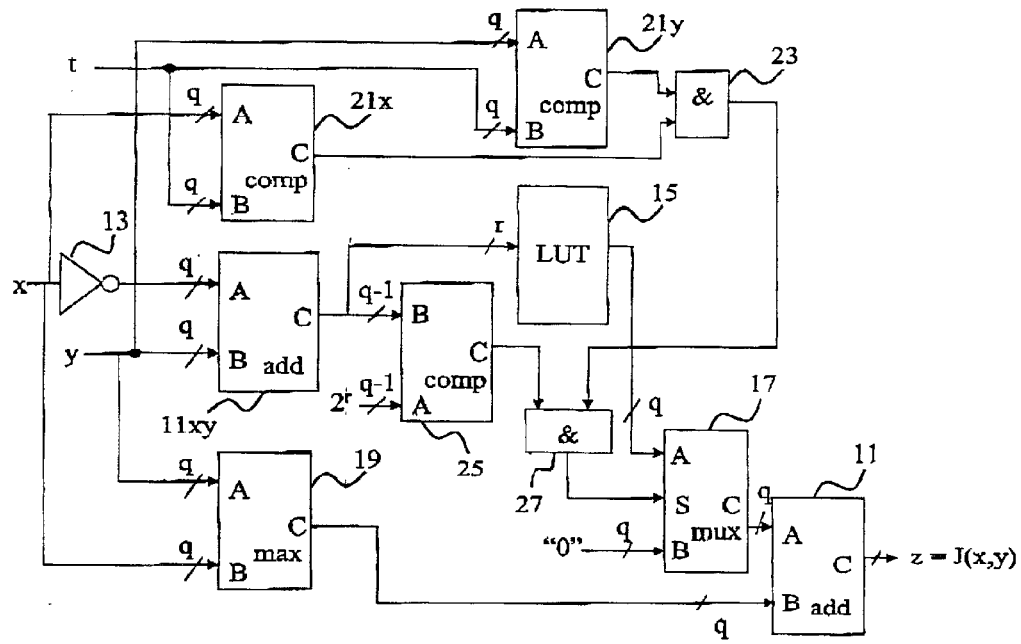
FIGS. 23a and 23b illustrate schematically two embodiments of a Jacobian logarithm calculation circuit according to the second aspect of the present invention.
Figure 23B:
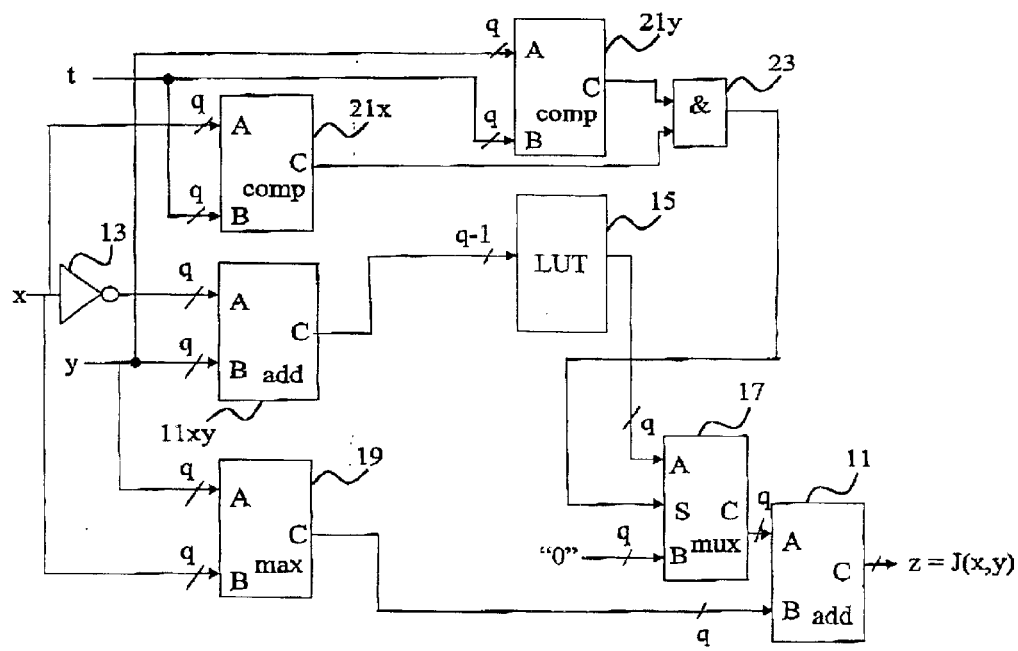

In the two implementations respectively illustrated by FIGS. 23a and 23b, the Jacobian logarithm J with two variables x and y, whose result is denoted z=J(x,y), is calculated in two's complement logic, on elements of q bits (i.e. with q channels in parallel, q being an integer greater than 1). A value of q greater than 4 will advantageously be taken.

The circuit for calculating J contains notably:
 two adders "add" 11xy and 11 of the synchronous type,
 an inverter 13;
 a look-up table "LUT" 15;
 a multiplexer "mux" 17 of the synchronous type;
 an element "max" 19 performing a maximum function, i.e. determining the maximum value amongst those which are supplied to it as an input;
 two comparators "comp" 21x and 21y; and
 an AND gate 23.

Each of these elements is known to persons skilled in the art and is therefore not described in detail here.

In the variant in FIG. 23a, the Jacobian logarithm calculation circuit also includes a supplementary comparator 25 and a supplementary "AND" gate 27.

These elements are however optional. Their functioning is described below.

The equations for the circuits are as follows ("C" designates the output of an element, "A" or "B" designates the input of an element and "S" designates the control input of the multiplexer 17):
 "add" 11xy and 11: C=A+B;
 "comp" 21x and 21y: C=1 if A>B and C=0 otherwise;
 "mux" 17: C=A if S=1 and C=B otherwise;
 "max" 19: C=A if A>B and C=B otherwise.

The look-up table 15 contains values of the correction function quantised on q bits. The look-up address, encoded in r bits, r being an integer greater than 1, is supplied as an input to the table 15.

The number of values stored in the table 15, denoted $V=2^r$, is equal at the most to $2^q$ and depends on the precision which it is wished to obtain in calculating J. It is of course possible to, choose $V<2^q$. By way of in no way limitative example, it is possible to choose q=8 and r=4.

By way of in no way limitative example, for q=8 and r=4, the table 15 contains, from the address "0000" to the address "1111", the following values:
 "00000101", "00000101", "00000100", "00000100",
 "00000011", "00000011", "00000010", "00000010",
 "00000010", "00000010", "00000001", "00000001",
 "00000001", "00000001", "00000001", "00000001".

In FIGS. 23a and 23b, the clocks are omitted in order to simplify the drawing, but it is obvious that all these elements are implemented in a synchronous logic.

The functioning of the circuits is as follows: the variable x is inverted by the inverter 13, and then added to the variable y by the adder 11xy, which is equivalent to subtracting x from y. The output of the adder 11xy is transmitted in q−1 bits since the sign bit is omitted, the operation corresponding to the correction function requiring only the absolute value of the difference.

This absolute value |y−x| addresses the look-up table 15.

In parallel, the variable x is compared with a threshold value t1 by the comparator 21x and the variable y is compared with a threshold value t2 by the comparator 21y. The "AND" gate 23 effects the logic addition of the outputs (denoted "C") of the comparators 21x and 21y.

If the value of x or y is less than the corresponding threshold value, respectively t1 or t2, then the control of the multiplexer 17 selects the representation of zero in q bits, denoted "0" in FIGS. 23a and 23b (input "B" of the multiplexer 17), instead of the output, of the look-up table 15 (input "A" of the multiplexer 17).

The threshold values can be either pre-wired or programmable. In the embodiments illustrated here, in order to simplify, t1=t2=t has been chosen.

The embodiments in FIGS. 23a and 23b differ through the mode of selection of "0" by the multiplexer 17.

In the variant in FIG. 23b, the output of the "AND" gate 23 is directly connected to the control input "S" of the multiplexer 17.

In the variant in FIG. 23a, the absolute value |y−x| output by the adder 11xy is also compared with the dimension of the look-up table 15, namely $V=2^r$ (=16="00010000" if r=4), by means of the comparator 25. The output of the comparator 25 is input to the "AND" gate 27 and the other input of the "AND" gate 27 receives the output value of the "AND" gate 23. The output of the "AND" gate 27 is supplied to the control input "S" of the multiplexer 17.

This variant enables the multiplexer 17 to select the representation of zero in q bits ("00000000" if q=8, denoted "0", in the drawings in order to simplify) instead of the output of the table 15 if the value |y−x| exceeds the dimension $V=2^r$ of the table 15. It is thus possible to impose the value 0 if it is not wished to repeat it many times in the table. A person skilled in the art can determine for what choice of the value V the implementation of table 15 requires more logic gates than such a comparator.

Moreover, the element 19 performing the maximum function receives x and y as an input and outputs the larger of these values, denoted max(x,y).

Finally, the adder 11 receives as an input, on the one hand, the value max(x,y) and, on the other hand, the output value of the multiplexer 17. The adder 11 outputs the sum of these two values, which is the Jacobian logarithm of x and y, denoted, z=J(x,y).

In order to implement the Jacobian logarithm calculation circuit which has just been described, the invention, proposes a hardware implementation of the calculation of the sum of the Jacobian logarithms which seeks a compromise between the speed of processing and the size of the hardware.

Figure 24:
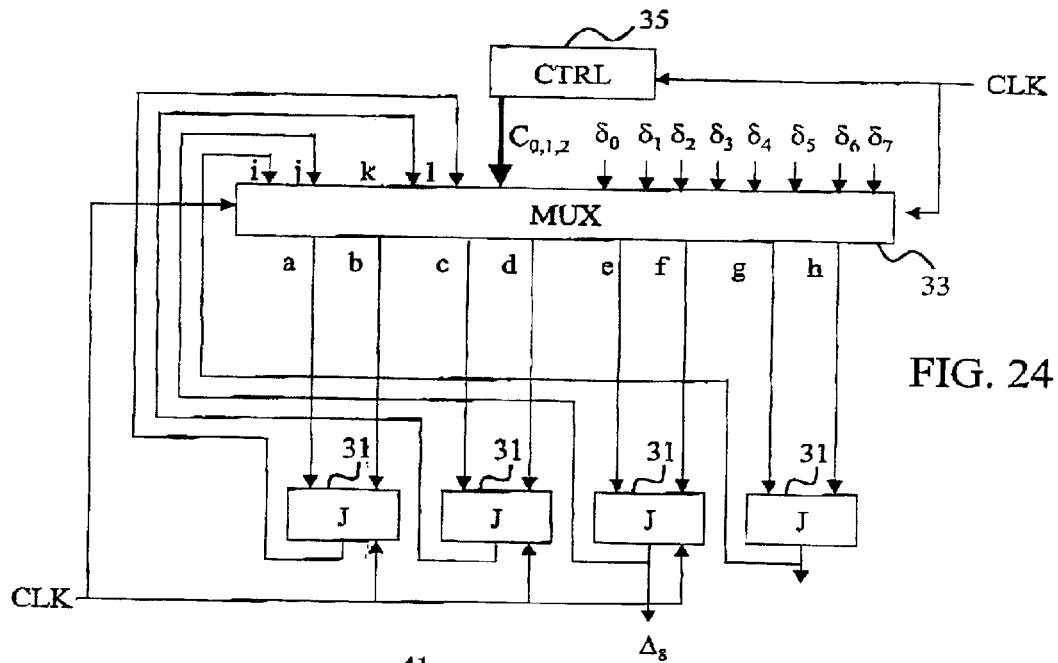
FIG. 24 illustrates schematically a circuit calculating the sum of the Jacobian logarithms according to the second aspect of the present invention, in a particular embodiment.

FIG. 24 illustrates such an embodiment in the form of a diagram, for an eight-state decoder where the calculation elements are quantised in 8 bits. The circuit shown in FIG. 19 can be used in place of the circuit shown in FIG. 24.

The circuit of FIG. 24 for calculating the sum of the Jacobian logarithms includes four units "J" for calculating the Jacobian logarithms 31 and a multiplexing module "MUX" 33.

The multiplexing module 33 is controlled by a control unit 35. The control unit 35, synchronised by a clock ("CLK"), outputs a signal which is either C0 (at the first clock beat) or C1 (at the second clock beat) or C2 (at the third clock beat).

For this, the control unit 35 can for example have a counter from 0 to 2, each value of which makes it possible to put one of the three signals in an active state (for example at the high level, that is to say a logic "1") and the other two in an inactive state. In FIG. 24, the signals C0, C1, C2 are designated as an abbreviation by the reference $C_{0,1,2}$.

Figure 18:
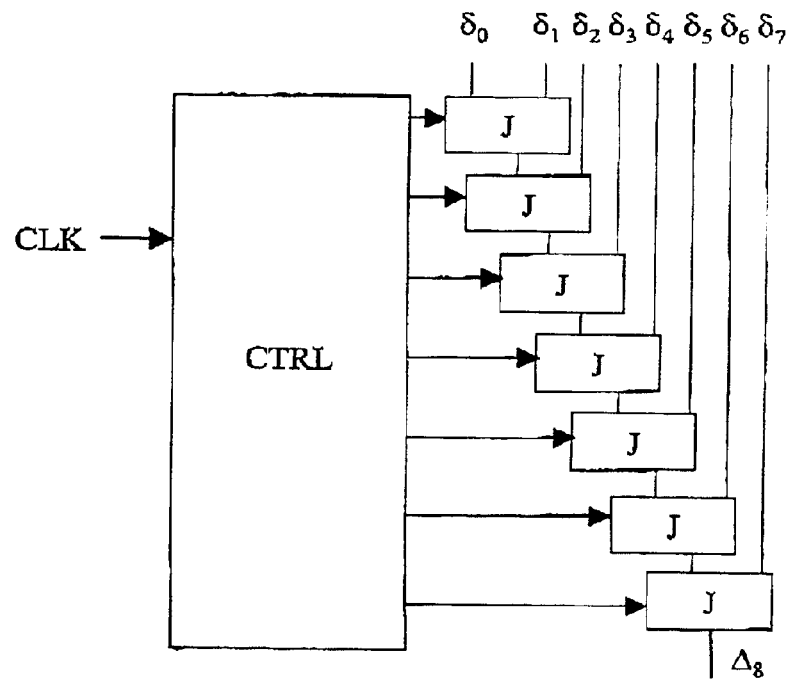
FIG. 18, already described, illustrates an example of calculation of the sum of Jacobian logarithms in cascade, for an 8-state encoder.

The variables $\delta_i$ for i=0, . . . , 7, and $\Delta_8$ are respectively similar to those in FIG. 18. The variables a, b, c, d, e, f, g, h designate the values output by the multiplexing module 33. The variables i, j, k, l designate the values respectively output by the four Jacobian logarithm calculation units 31.

The multiplexing module 33 can for example function as follows:

if the value of the counter is 0 (that is to say C0=1) then MUX outputs a=$\delta_0$, b=$\delta_1$, c=$\delta_2$, d=$\delta_3$, e=$\delta_4$, f=$\delta_5$, g=$\delta_6$ and h=$\delta_7$.

if the value of the counter is 1 (that is to say C1=1) then MUX outputs a=i, b=j, c=k and d=l.

if the value of the counter is 2 (that is to say C2=1) then MUX outputs e=k and f=l.

Figure 25A:
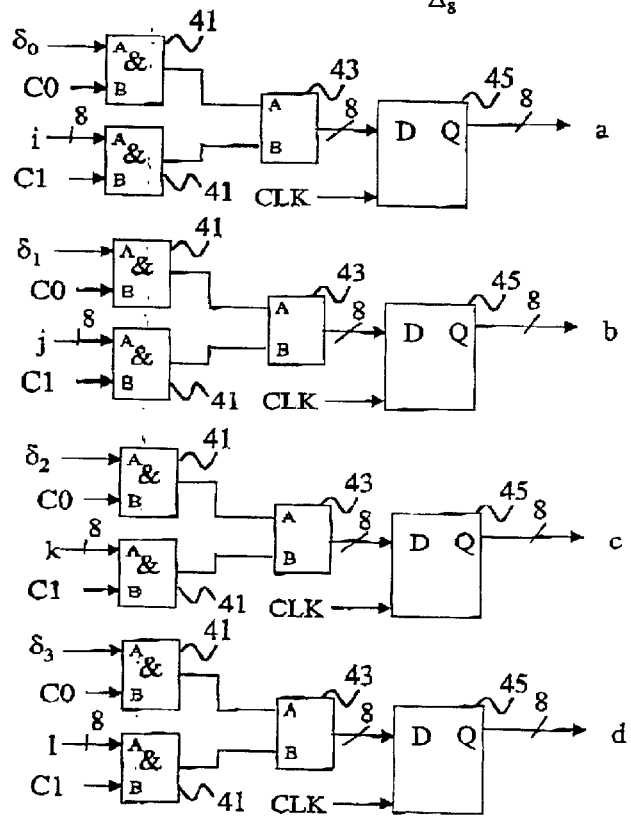
FIGS. 25a and 25b illustrate in more detail a multiplexing module included in the circuit of FIG. 24.
Figure 25B:
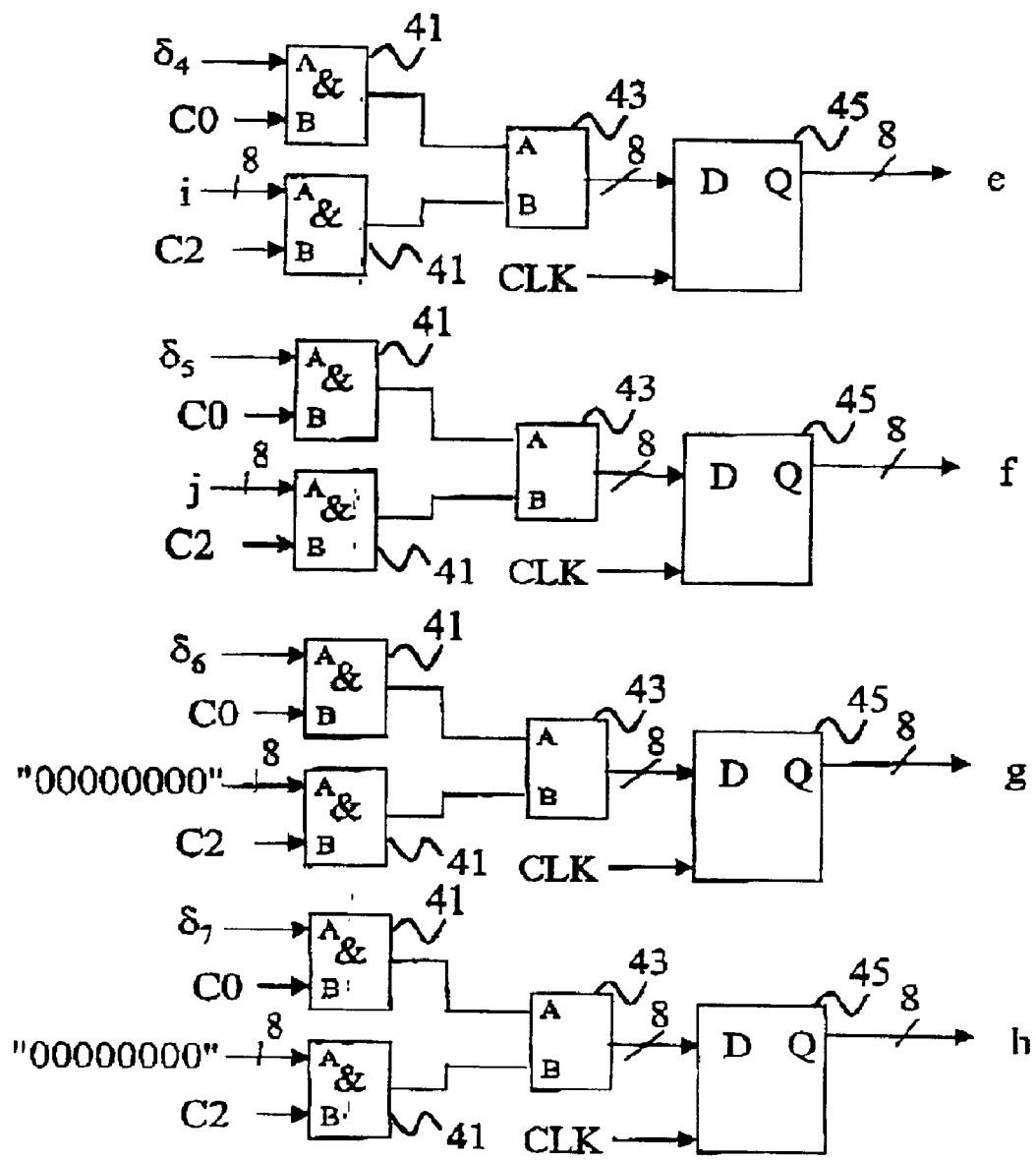

The multiplexing module 33 can be produced in any form deemed appropriate. FIGS. 25a and 25b illustrate a possible embodiment, by means of logic gates, for q=8. FIG. 25a illustrates that part of the multiplexing module 33 which corresponds to the outputs a, b, c, d. FIG. 25b illustrates that part of the multiplexer module 33 which corresponds to the outputs e, f, g, h.

Logic gates will be chosen having transit times which are sufficiently low to comply with the synchronism.

In FIGS. 25a and 25b, the elements 41 are "AND" gates, the elements 43 are "OR" gates, the elements 45 are D type flip-flops.

The circuits in FIGS. 25a and 25b operate as follows. For example, if C0=1 and C1=0, the data of $\delta_0$ are presented to the flip-flop 45 and stored, and then, after the clock beat, appear at the output a. It is clear that C0, C1 and C2 cannot simultaneously have the value 1. If C0=0 and C1=1, the data of i are presented to the flip-flop 45 and stored, and then, after the clock beat, appear at the output a. The other elements, corresponding to the outputs b to h, function in a similar fashion.

Implementation of the second aspect of the invention by means of programmed logic and on a signal processor has shown that the corresponding estimation method and device have better performance than conventional implementations.

What is claimed is:

1. A device for estimating a series of symbols, the symbols being related to each other by a parity relationship previously created by an encoder, the estimation taking place through a function having several components performing a calculation of probabilities corresponding to a state of the encoder, the probabilities including:

first probability values, resulting from an observation of the effects of previous states of said encoder on the current state, second probability values, resulting from the observation of the effects of subsequent states of the encoder on the current state, and third probability values, representing the belonging of a symbol to a predetermined part of an encoding alphabet; the device comprising:

calculation means;

specific multiplexing means;

means for controlling said multiplexing means; and storage means, for storing estimations of the symbols, said multiplexing means being controlled by said control means and adapted to cooperate with said calculation means so that, not only the first and second probability values, but also the third probability values, are obtained by the same circuit from a plurality of predetermined parameters.

2. The device according to claim 1, wherein said means for controlling said multiplexing means includes a state machine.

3. The device according to claim 1, wherein said calculation means are adapted to calculating Jacobian logarithms.

4. The device according to claim 1, wherein the encoder is associated with a predetermined encoding trellis, said device further comprising means adapted to describe the trellis, in an up direction and in a down direction.

5. The device according to claim 1, being implemented by the use of tools utilizing a VHDL language.

6. A decoding device, including an estimation device according to claim 1.

7. A field programmable gate array, having an estimation device according to claim 1.

8. A programmed logic circuit, having an estimation device according to claim 1.

9. A digital signal processing apparatus, having an estimation device according to claim 1.

10. A telecommunications network, having an estimation device according to claim 1.

11. A mobile station in a telecommunications network, having an estimation device according to claim 1.

12. A base station in a telecommunications network, having an estimation device according to claim 1.

13. The device according to claim 4, wherein said means of describing the trellis comprises first and second pluralities of tables of dimension M×2, M being the number of possible states of the encoder, said first plurality of tables being adapted to describe the trellis in the up calculation direction, taking account of the influence of the previous state of the encoder on the current state, and said second plurality of tables being adapted to describe the trellis in the down calculation direction, taking account of the influence of the subsequent state of the encoder on the current state.

14. The decoding device according to claim 6, comprising at least one turbodecoder.

15. The decoding device according to claim 6, being implemented by the use of tools utilizing a VHDL language.

16. A field programmable gate array, having a decoding device according to claim 6.

17. A programmed logic circuit, having a decoding device according to claim 6.

18. A digital signal processing apparatus, having a decoding device according to claim 6.

19. A telecommunications network, having a decoding device according to claim 6.

20. A mobile station in a telecommunications network, having a decoding device according to claim 6.

21. A base station in a telecommunications network, having a decoding device according to claim 6.

22. A method of estimating a series of symbols, the symbols being linked together by a parity relationship previously created by an encoder, the estimation taking place by means of a function having several components effecting a calculation of probabilities corresponding to a state of the encoder, said probabilities having:

first probability values, resulting from an observation of the effects of previous states of said encoder on the current state, second probability values, resulting from the observation of the effects of subsequent states of said encoder on the current state, and third probability values, representing the belonging of a symbol to a predetermined part of an encoding alphabet, the method including:

at least one calculation step;

at least one specific multiplexing step;

at least one step controlling said multiplexing step; and at least one storage step, for storing estimations of the symbols, said multiplexing step being controlled by said control step and being combined with said calculation step so that, not only the first and second probability values, but also the third probability values, are obtained by the same circuit from a plurality of predetermined parameters.

23. The method according to claim 22, in which said step of controlling said multiplexing step includes using a state machine.

24. The method according to claim 22, in which, during said calculation step, Jacobian logarithms are calculated.

25. The method according to claim 22, wherein the encoder is associated with a predetermined coding trellis, said method further including the step of describing the trellis, in an up direction and in a down direction.

26. A decoding method, using an estimation method according to claim 22.

27. The method according to claim 25, in which said trellis description step uses first and second pluralities of tables of dimension M×2, M being the number of possible states of the encoder, the first plurality of tables being adapted to describe the trellis in the up calculation direction, taking account of the influence of the previous state of the encoder on the current state, and the second plurality of tables being adapted to describe the trellis in the down calculation direction, taking account of the influence of the subsequent state of the encoder on the current state.

28. A decoding method according to claim 26, using at least one turbodecoding step.

29. A method of estimating a series of symbols, the symbols being linked together by a parity relationship previously created by an encoder, the estimation being effected by a function having several components performing a calculation of probabilities corresponding to a state of the encoder, said method including the steps of:

comparing first values of probabilities with a first predetermined threshold value, comparing second values of probabilities with a second predetermined threshold value, and if at least one of the first or second values of probabilities is less than the corresponding first or second predetermined threshold value, modifying at least one of the components of said function.

30. The method according to claim 29, in which said function represents at least one addition operation, at least one comparison operation, and at least one correction operation of applying a correction factor.

31. The method according to claim 29, in which:

a first component of said function represents a multiplexing operation, and a second component of said function represents an operation of calculating Jacobian logarithms, wherein, during said modification step, if at least one of the first or second probability values is less than the corresponding first and second predetermined threshold value, the second component of the function is modified.

32. A decoding method, implementing an estimation method according to claim 29.

33. A field programmable gate array, having means adapted to implement an estimation method according to claim 29.

34. A programmed logic circuit, having means adapted to implement an estimation method according to claim 29.

35. A digital signal processing apparatus, having means adapted to implement an estimation method according to claim 29.

36. A telecommunications network, including means adapted to implement an estimation method according to claim 29.

37. A mobile station in a telecommunications network, including means adapted to implement an estimation method according to claim 29.

38. A base station in a telecommunications network, including means adapted to implement an estimation method according to claim 29.

39. An information storage means which can be read by a computer or a microprocessor storing instructions of a computer program, making it possible to implement an estimation method according to claim 29.

40. An information storage means which is removable, partially or totally, and which can be read by a computer or a microprocessor storing instructions of a computer program, making it possible to implement an estimation method according to claim 29.

41. A computer program product containing sequences of instructions for implementing an estimation method according to claim 29.

42. The method according to claim 30, wherein the correction factor may be zero.

43. The method according to claim 30, in which said modification step relates to the correction operation.

44. The decoding method according to claim 32, implementing at least one turbodecoding step.

45. A field programmable gate array, having means adapted to implement a decoding method according to claim 32.

46. A programmed logic circuit, having means adapted to implement a decoding method according to claim 32.

47. A digital signal processing apparatus, having means adapted to implement a decoding method according to claim 32.

48. A telecommunications network, including means adapted to implement a decoding method according to claim 32.

49. A mobile station in a telecommunications network, including means adapted to implement a decoding method according to claim 32.

50. A base station in a telecommunications network, including means adapted to implement a decoding method according to claim 32.

51. An information storage means which can be read by a computer or a microprocessor storing instructions of a computer program, making it possible to implement a decoding method according to claim 32.

52. An information storage means which is removable, partially or totally, and which can be read by a computer or a microprocessor storing instructions of a computer program, making it possible to implement a decoding method according to claim 32.

53. A computer program product containing sequences of instructions for implementing a decoding method according to claim 32.

54. A device for estimating a series of symbols, the symbols being linked to each other by a parity relationship previously created by an encoder, the estimation being effected by a function having several components effecting a calculation of probabilities corresponding to a state of the encoder, said device comprising:

means for comparing first probability values with a first predetermined threshold value, means for comparing second probability values with a second predetermined threshold value, and means for modifying at least one of the components of said function if at least one of the first or second probability values is less than the corresponding first or second predetermined threshold value.

55. The device according to claim 54, wherein said function is performed by at least one addition means, at least one comparison means, and at least one correction means adapted to apply a correction factor.

56. The device according to claim 54, in which:

a first component of said function is produced by multiplexing means, and a second component of said function is produced by Jacobian logarithm calculation means, wherein the modification means are adapted to modify the second component of the function if at least one of the first or second probabilities values is less than the corresponding first or second predetermined threshold value.

57. The device according to claim 54, being implemented by the use of tools utilizing a VHDL language.

58. A decoding device, having an estimation device according to claim 54.

59. The device according to claim 55, wherein the correction factor may be zero.

60. The device according to claim 55, wherein said modification means act on the correction means.

61. The decoding device according to claim 58, having at least one turbodecoder.

62. The decoding device according to claim 58, being implemented by the use of tools utilizing a VHDL language.

* * * * *

UNITED STATES PATENT AND TRADEMARK OFFICE
CERTIFICATE OF CORRECTION

PATENT NO. : 6,877,125 B2
APPLICATION NO. : 09/953254
DATED : April 5, 2005
INVENTOR(S) : Philippe Le Bars et al.

It is certified that error appears in the above-identified patent and that said Letters Patent is hereby corrected as shown below:

ON THE TITLE PAGE [56] REFERENCES CITED:

Other Publications, after Michael: "et al," should read --et al.,--;
after Berrou (first occurrence): "N" should read --New-- and "w" should be deleted;
after Berrou (second occurrence): "et al." should read --et al.,--;
after Pietrobon (first occurrence): "Us" should read --Use--;
after Robertson: "t al.," should read --et al.,-- and "Suitabl" should read --Suitable-- and "D coding" should read --Decoding-- and "V 1.8," should read --Vol. 8,--.

COLUMN 3:

Line 42, "$\alpha_0(0)=1$ and $\alpha_0(s\approx 0)=0$" should read --$\alpha_0(0)=1$ and $\alpha_0(s\neq 0)=0$
"$\beta_N(0)=1$ and $\beta_N(s\approx 0)=0$" should read --$\beta_N(0)=1$ and $\beta_N(s\neq 0)=0$--.

COLUMN 4:

Line 11, "$p(s',s|Y)/p(y_k)=\alpha_{k-1}(s')\gamma_k(s',s)\beta_k(s)$     (5)" should read --$p(s',s|Y)/p(y_k)= \tilde{\alpha}_{k-1}(s')\gamma_k(s',s) \tilde{\beta}_k(s)$     (5)--.

COLUMN 9:

Line 40, "$\delta_1$" should read --$\delta_i$--; and
Line 41, "etc." should read --etc.,--.

COLUMN 10:

Line 15, "constraints" should read --constraints.--; and
Line 45, "$J(\Delta,\delta)=\ln(e^{\Delta i}+e^{\delta})=\max(\Delta,\delta)+f_c(|\Delta-\delta|)$, (E1)" should read
--$J(\Delta,\delta)=\ln(e^{\Delta}+e^{\delta})=\max(\Delta,\delta)+f_c(|\Delta-\delta|)$, (E1)--.

COLUMN 15:

Line 65, "which it is sought to simplify" should read --in which simplicity is sought--.

UNITED STATES PATENT AND TRADEMARK OFFICE
CERTIFICATE OF CORRECTION

PATENT NO. : 6,877,125 B2
APPLICATION NO. : 09/953254
DATED : April 5, 2005
INVENTOR(S) : Philippe Le Bars et al.

It is certified that error appears in the above-identified patent and that said Letters Patent is hereby corrected as shown below:

COLUMN 16:
        Line 15, "(e.g. should read --(e.g.,--;
        Line 34, "(e.g. should read --(e.g.,--;
        Line 35, "(e.g. should read --(e.g.,--; and
        Line 43, "in" (first occurrence) should read --is-- and "the" should be deleted.

COLUMN 17:
        Line 37, "limitatively." should read --limitative.--.

COLUMN 18:
        Line 39, "called;" should read --called:--.

COLUMN 19:
        Line 65, "implementation" should read --implementation.--

COLUMN 20:
        Line 10, "$g(x)=1+x^2+x^3 \equiv 1011=11.$" should read --$g(x)=1+x^2+x^3 \equiv 1011=11,$--; and
        Line 45, "symbol;" should read --symbol:--.

COLUMN 21:
        Line 64, "high;" should read --high--.

COLUMN 22:
        Line 1, "i.e." should read --i.e.,--;
        Line 13, "case;" should read --case,--;
        Line 39, "camera" should read --camera,--; and
        Line 44, "reception," should read --reception--.

COLUMN 23:
        Line 34, "(i.e." should read --(i.e.,--; and
        Line 44, "i.e." should read --i.e.,--.

COLUMN 24:

Line 4, "to," should read --to--.

UNITED STATES PATENT AND TRADEMARK OFFICE
CERTIFICATE OF CORRECTION

PATENT NO. : 6,877,125 B2
APPLICATION NO. : 09/953254
DATED : April 5, 2005
INVENTOR(S) : Philippe Le Bars et al.

It is certified that error appears in the above-identified patent and that said Letters Patent is hereby corrected as shown below:

<u>COLUMN 25</u>:

Line 2, "invention," should read --invention--;
    Line 33, "if" should read --If--;
    Line 36, "if" should read --If--; and
    Line 38, "if" should read --If--.

<u>COLUMN 30</u>:

Line 16, "are" should read --is--; and
    Line 28, "act" should read --acts--.

Signed and Sealed this

Thirty-first Day of July, 2007

JON W. DUDAS
*Director of the United States Patent and Trademark Office*